(12) United States Patent
Kanda et al.

(10) Patent No.: US 7,196,950 B2
(45) Date of Patent: Mar. 27, 2007

(54) NON-VOLATILE SEMICONDUCTOR STORAGE DEVICE PERFORMING ROM READ OPERATION UPON POWER-ON

(75) Inventors: Kazushige Kanda, Kawasaki (JP); Hiroshi Nakamura, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/359,898

(22) Filed: Feb. 16, 2006

(65) Prior Publication Data

US 2006/0139985 A1    Jun. 29, 2006

Related U.S. Application Data

(63) Continuation of application No. 10/648,853, filed on Aug. 26, 2003, now Pat. No. 7,116,603.

(30) Foreign Application Priority Data

Oct. 30, 2002    (JP)    .............................. 2002-316350

(51) Int. Cl.
*G11C 7/00*    (2006.01)
(52) U.S. Cl. .................................. 365/194; 365/185.17
(58) Field of Classification Search ................. 365/194, 365/185.17
See application file for complete search history.

(56) References Cited

U.S. PATENT DOCUMENTS

| | | | |
|---|---|---|---|
| 3,701,043 A | 10/1972 | Zuleeg et al | 331/94.5 |
| 3,705,316 A | 12/1972 | Burrous et al. | 307/311 |
| 3,863,075 A | 1/1975 | Uronmonger et al. | 250/552 |
| 3,889,147 A | 6/1975 | Groves | 313/500 |
| 4,149,111 A | 4/1979 | Coates, Jr. | 315/169.4 |
| 4,243,985 A | 1/1981 | Quayle | 340/753 |
| 4,298,806 A | 11/1981 | Herold | 250/504 |
| 4,301,461 A | 11/1981 | Asano | 357/17 |
| 4,319,306 A | 3/1982 | Stanuch | 362/35 |
| 4,342,944 A | 8/1982 | Spring Thorpe | 313/499 |
| 4,368,979 A | 1/1983 | Ruell | 356/71 |
| 4,390,931 A | 6/1983 | Gorick et al. | 362/267 |
| 4,434,510 A | 2/1984 | Lemelson | 455/603 |
| 4,445,132 A | 4/1984 | Ichikawa et al. | 357/32 |
| 4,598,198 A | 7/1986 | Fayfield | 250/205 |
| 4,614,866 A | 9/1986 | Liss et al. | 250/214 |

(Continued)

FOREIGN PATENT DOCUMENTS

DE    43 04 216 A1    8/1994

(Continued)

OTHER PUBLICATIONS

U.S. Appl. No. 60/405,592, filed Aug. 23, 2002, Pederson.

(Continued)

*Primary Examiner*—M. Tran
(74) *Attorney, Agent, or Firm*—Hogan & Hartson LLP

(57) ABSTRACT

A power-on reset circuit has a power-on level detecting circuit which detects a power voltage to output a power-on reset signal and a delay circuit which delays the power-on reset signal output by the power-on level detecting circuit. Two chip address specifying pads are connected to the delay circuit. Delay time in the delay time is controlled according to a chip address supplied to these two pads.

13 Claims, 15 Drawing Sheets

U.S. PATENT DOCUMENTS

| | | | |
|---|---|---|---|
| 4,615,131 A | 10/1986 | Wakatake | 40/473 |
| 4,616,225 A | 10/1986 | Woudenberg | 340/908 |
| 4,630,180 A | 12/1986 | Muraki et al. | 362/223 |
| 4,630,183 A | 12/1986 | Fujita | 362/311 |
| 4,633,280 A | 12/1986 | Takasu | 357/17 |
| 4,654,629 A | 3/1987 | Bezos et al. | 340/87 |
| 4,703,219 A | 10/1987 | Mesquida | 313/111 |
| 4,710,977 A | 12/1987 | Lemelson | 455/603 |
| 4,716,296 A | 12/1987 | Bussiere et al. | 250/504 |
| 4,720,835 A | 1/1988 | Akiba et al. | 372/50 |
| 4,724,312 A | 2/1988 | Snaper | 250/203 |
| 4,799,135 A | 1/1989 | Inukai et al. | 362/296 |
| 4,821,338 A | 4/1989 | Naruse et al. | 455/617 |
| 4,918,497 A | 4/1990 | Edmond | 357/17 |
| 4,929,866 A | 5/1990 | Murata et al. | 313/500 |
| 4,935,665 A | 6/1990 | Murata | 313/500 |
| 4,954,822 A | 9/1990 | Borenstein | 340/925 |
| 4,965,644 A | 10/1990 | Kawabata et al. | 357/17 |
| 4,966,862 A | 10/1990 | Edmond | 437/100 |
| 4,990,970 A | 2/1991 | Fuller | 357/17 |
| 5,000,569 A | 3/1991 | Nylund | 356/237 |
| 5,027,168 A | 6/1991 | Edmond | 357/17 |
| 5,035,055 A | 7/1991 | McCullough | 30/276 |
| 5,038,406 A | 8/1991 | Titterton et al. | 359/113 |
| 5,045,767 A | 9/1991 | Wakatake | 318/696 |
| 5,050,055 A | 9/1991 | Lindsay et al. | 362/293 |
| 5,060,303 A | 10/1991 | Wilmoth | 359/152 |
| 5,067,788 A | 11/1991 | Jannson et al. | 385/2 |
| D324,921 S | 3/1992 | Stanuch et al. | D26/35 |
| 5,093,768 A | 3/1992 | Ohe | 362/241 |
| 5,097,397 A | 3/1992 | Stanuch et al. | 362/74 |
| 5,097,612 A | 3/1992 | Williams | 40/591 |
| 5,101,326 A | 3/1992 | Roney | 362/61 |
| 5,122,943 A | 6/1992 | Pugh | 362/256 |
| 5,136,287 A | 8/1992 | Borenstein | 340/925 |
| 5,159,486 A | 10/1992 | Webb | 359/229 |
| 5,164,992 A | 11/1992 | Turk et al. | 382/2 |
| 5,182,647 A | 1/1993 | Chang | 358/213.11 |
| 5,187,547 A | 2/1993 | Niina et al. | 257/77 |
| 5,206,831 A | 4/1993 | Wakamatsu | 365/200 |
| 5,220,235 A | 6/1993 | Wakimizu et al. | 313/25 |
| 5,224,773 A | 7/1993 | Arimura | 362/227 |
| 5,233,204 A | 8/1993 | Fletcher et al. | 257/13 |
| 5,235,498 A | 8/1993 | Van Dulman et al. | 362/296 |
| 5,283,425 A | 2/1994 | Imamura | 250/208 |
| 5,291,196 A | 3/1994 | Defour | 340/961 |
| 5,298,738 A | 3/1994 | Gebert et al. | 250/222 |
| 5,302,965 A | 4/1994 | Belcher et al. | 345/31 |
| 5,313,187 A | 5/1994 | Choi et al. | 340/331 |
| 5,321,593 A | 6/1994 | Moates | 362/251 |
| 5,357,123 A | 10/1994 | Sugawara | 257/88 |
| 5,357,409 A | 10/1994 | Glatt | 362/105 |
| 5,359,255 A | 10/1994 | Kawai et al. | 313/17 |
| 5,359,669 A | 10/1994 | Shanley et al. | 382/6 |
| 5,361,190 A | 11/1994 | Roverts et al. | 362/61 |
| 5,362,971 A | 11/1994 | McMahon et al. | 250/577 |
| 5,381,155 A | 1/1995 | Gerber | 342/104 |
| 5,400,140 A | 3/1995 | Johnson | 356/345 |
| 5,403,916 A | 4/1995 | Watanabe et al. | 437/127 |
| 5,406,095 A | 4/1995 | Koyama et al. | 257/88 |
| 5,410,328 A | 4/1995 | Yoksza et al. | 345/82 |
| 5,416,627 A | 5/1995 | Wilmoth | 359/159 |
| 5,419,065 A | 5/1995 | Lin | 40/550 |
| 5,422,623 A | 6/1995 | Bader et al. | 340/331 |
| 5,434,693 A | 7/1995 | Tanaka et al. | 359/180 |
| 5,450,301 A | 9/1995 | Waltz et al. | 362/231 |
| 5,465,142 A | 11/1995 | Krumes et al. | 356/5.01 |
| 5,475,241 A | 12/1995 | Harrah et al. | 257/99 |
| 5,482,896 A | 1/1996 | Tang | 437/209 |
| 5,490,049 A | 2/1996 | Montalan et al. | 362/240 |
| 5,491,350 A | 2/1996 | Unno et al. | 257/99 |
| 5,498,883 A | 3/1996 | Lebby et al. | 257/95 |
| 5,514,627 A | 5/1996 | Lowery et al. | 437/209 |
| 5,516,727 A | 5/1996 | Broom | 437/211 |
| 5,519,720 A | 5/1996 | Hirano et al. | 372/36 |
| 5,526,229 A | 6/1996 | Wakabayashi et al. | 361/702 |
| 5,526,237 A | 6/1996 | Davenport et al. | 362/32 |
| 5,528,474 A | 6/1996 | Roney et al. | 362/249 |
| 5,532,472 A | 7/1996 | Furuta | 250/214 |
| 5,567,036 A | 10/1996 | Theobald et al. | 362/80 |
| 5,568,406 A | 10/1996 | Gerber | 364/562 |
| 5,569,939 A | 10/1996 | Choi | 257/94 |
| 5,575,459 A | 11/1996 | Anderson | 362/240 |
| 5,580,156 A | 12/1996 | Suzuki et al. | 362/184 |
| 5,585,783 A | 12/1996 | Hall | 340/473 |
| 5,593,223 A | 1/1997 | Koizumi | 362/255 |
| 5,598,290 A | 1/1997 | Tanaka et al. | 359/180 |
| 5,606,444 A | 2/1997 | Johnson et al. | 359/152 |
| 5,612,231 A | 3/1997 | Holm et al. | 437/23 |
| 5,625,201 A | 4/1997 | Holm et al. | 257/88 |
| 5,627,851 A | 5/1997 | Takahashi | 372/44 |
| 5,631,474 A | 5/1997 | Saitoh | 257/88 |
| 5,632,551 A | 5/1997 | Roney et al. | 362/249 |
| 5,634,711 A | 6/1997 | Kennedy et al. | 362/119 |
| 5,636,916 A | 6/1997 | Sokolowski | 362/61 |
| 5,656,829 A | 8/1997 | Sakaguchi et al. | 257/94 |
| 5,661,645 A | 8/1997 | Hochstein | 363/89 |
| 5,661,742 A | 8/1997 | Huang et al. | 372/46 |
| 5,674,000 A | 10/1997 | Kalley | 362/293 |
| 5,694,112 A | 12/1997 | VannRox et al. | 340/472 |
| 5,696,500 A | 12/1997 | Diem | 340/825.44 |
| 5,697,175 A | 12/1997 | Schwartz | 40/552 |
| 5,705,047 A | 1/1998 | Lee | 205/123 |
| 5,707,891 A | 1/1998 | Izumi et al. | 437/120 |
| 5,710,833 A | 1/1998 | Moghaddam et al. | 382/228 |
| 5,723,535 A | 3/1998 | Krismer et al. | 315/185 |
| 5,726,786 A | 3/1998 | Heflinger | 359/152 |
| 5,734,337 A | 3/1998 | Kupersmit | 340/937 |
| 5,734,343 A | 3/1998 | Urbish et al. | 340/942 |
| 5,739,552 A | 4/1998 | Kimura et al. | 257/89 |
| 5,739,592 A | 4/1998 | Rigsby et al. | 307/9.1 |
| 5,758,947 A | 6/1998 | Glatt | 362/105 |
| 5,760,531 A | 6/1998 | Pederson | 313/25 |
| 5,785,418 A | 7/1998 | Hochstein | 362/373 |
| 5,786,918 A | 7/1998 | Suzuki et al. | 359/135 |
| 5,789,768 A | 8/1998 | Lee et al. | 257/96 |
| 5,793,062 A | 8/1998 | Kish, Jr. et al. | 257/98 |
| 5,796,376 A | 8/1998 | Banks | 345/82 |
| 5,804,822 A | 9/1998 | Brass et al. | 250/302 |
| 5,805,081 A | 9/1998 | Fikacek | 240/908 |
| 5,806,965 A | 9/1998 | Deese | 362/249 |
| 5,808,592 A | 9/1998 | Mizutani et al. | 345/83 |
| 5,808,944 A | 9/1998 | Yoshitake et al. | 365/200 |
| 5,809,161 A | 9/1998 | Auty et al. | 382/104 |
| 5,826,007 A | 10/1998 | Sakaki et al. | 714/42 |
| 5,826,965 A | 10/1998 | Lyons | 362/74 |
| 5,828,055 A | 10/1998 | Jebens | 350/214 |
| 5,831,155 A | 11/1998 | Hewitt | 43/117.4 |
| 5,838,024 A | 11/1998 | Masuda et al. | 257/98 |
| 5,838,247 A | 11/1998 | Bladowski | 340/815.45 |
| 5,848,837 A | 12/1998 | Gustafson | 362/235 |
| 5,872,646 A | 2/1999 | Alderman et al. | 359/169 |
| 5,875,261 A | 2/1999 | Fitzpatrick et al. | 382/165 |
| 5,898,381 A | 4/1999 | Gartner et al. | 340/815.65 |
| 5,900,850 A | 5/1999 | Bailer et al. | 345/55 |
| 5,917,637 A | 6/1999 | Ishikawa et al. | 359/181 |
| 5,929,788 A | 7/1999 | Vukosic | 340/908.1 |
| 5,931,562 A | 8/1999 | Arato | 362/184 |
| 5,931,570 A | 8/1999 | Yamuro | 362/355 |
| 5,932,860 A | 8/1999 | Plesko | 235/454 |
| 5,934,694 A | 8/1999 | Schugt et al. | 280/33.991 |
| 5,939,996 A | 8/1999 | Kniveton et al. | 340/815.4 |
| 5,946,417 A | 8/1999 | Bonneau et al. | 382/236 |
| 5,948,038 A | 9/1999 | Daly et al. | 701/117 |

| | | | | | | |
|---|---|---|---|---|---|---|
| 5,959,752 | A | 9/1999 | Ota ............................ 359/152 | EP | 0 531 184 A1 | 3/1993 |
| 5,960,135 | A | 9/1999 | Ozawa ........................ 385/24 | EP | 0 531 185 A1 | 3/1993 |
| 5,965,879 | A | 10/1999 | Leviton ................. 205/231.13 | EP | 0 596 782 A1 | 5/1994 |
| 5,975,714 | A | 11/1999 | Vetorino et al. ............. 362/192 | EP | 0 633 163 A1 | 1/1995 |
| 5,990,802 | A | 11/1999 | Maskeny ................... 340/815.45 | EP | 0 688 696 A2 | 6/1995 |
| 6,009,650 | A | 1/2000 | Lamparter ..................... 40/572 | EP | 0 709 818 A1 | 9/1995 |
| 6,014,237 | A | 1/2000 | Abeles et al. ............... 359/124 | EP | 0 793 403 B1 | 9/1997 |
| 6,018,899 | A | 2/2000 | Hanitz ......................... 40/473 | EP | 0 896 898 A2 | 7/1998 |
| 6,028,694 | A | 2/2000 | Schmidt ..................... 359/264 | EP | 0 887 783 A2 | 12/1998 |
| 6,035,053 | A | 3/2000 | Yoshioka et al. ............ 382/104 | EP | 0 890 894 A1 | 1/1999 |
| 6,035,055 | A | 3/2000 | Wang et al. ................. 382/118 | EP | 0 967 590 A1 | 12/1999 |
| 6,035,074 | A | 3/2000 | Fujimoto et al. ............ 382/282 | EP | 1 043 189 A2 | 10/2000 |
| 6,067,018 | A | 5/2000 | Skelton et al. ............ 340/573.3 | FR | 2 658 024 A1 | 8/1991 |
| 6,072,893 | A | 6/2000 | Luo et al. .................... 382/117 | FR | 2 680 861 A1 | 3/1993 |
| 6,081,206 | A | 6/2000 | Kielland ..................... 340/397 | FR | 2 707 22 A1 | 1/1995 |
| 6,088,281 | A | 7/2000 | Miyakawa et al. ....... 365/225.7 | FR | 2 800 500 | 5/2001 |
| 6,091,025 | A | 7/2000 | Cotter et al. ................. 174/110 | GB | 2 069 257 A | 8/1981 |
| 6,095,661 | A | 8/2000 | Lebens et al. ............... 362/184 | GB | 2 175 428 A | 11/1986 |
| 6,102,696 | A | 8/2000 | Osterwalder et al. ......... 433/29 | GB | 2 330 679 A | 4/1989 |
| 6,111,671 | A | 8/2000 | Bahuguna et al. ............ 359/30 | GB | 2 240 650 A | 8/1991 |
| 6,118,388 | A | 9/2000 | Morrison ..................... 340/908 | GB | 2 272 791 A | 5/1994 |
| 6,121,898 | A | 9/2000 | Moetteli ..................... 340/933 | GB | 2 292 450 A | 8/1994 |
| 6,159,005 | A | 12/2000 | Herold et al. ................. 433/29 | GB | 2 311 401 A | 9/1997 |
| 6,177,678 | B1 | 1/2001 | Brass et al. ............... 250/461.1 | JP | 09-205349 | 8/1997 |
| 6,181,805 | B1 | 1/2001 | Koike et al. ................. 382/118 | JP | 2002-100974 | 4/2002 |
| 6,183,100 | B1 | 2/2001 | Suckow et al. ............... 362/35 | KR | 1997-0051367 | 7/1997 |
| 6,389,115 | B1 | 5/2002 | Swistock ................. 379/88.112 | WO | 99/42985 A1 | 2/1999 |
| 6,389,155 | B2 | 5/2002 | Funayama et al. .......... 382/118 | WO | 99/35634 A1 | 7/1999 |
| 6,396,954 | B1 | 5/2002 | Kondo ........................ 382/224 | WO | 00/74975 A1 | 12/2000 |
| 6,400,828 | B2 | 6/2002 | Covell et al. ................ 382/100 | WO | 01/10674 A1 | 2/2001 |
| 6,404,683 | B1 | 6/2002 | Yumoto ...................... 365/200 | | | |
| 6,462,995 | B2 | 10/2002 | Urakawa .................... 365/200 | | | |
| 6,642,757 | B2 * | 11/2003 | Ikehashi et al. ............. 327/143 | | | |
| 6,751,122 | B2 * | 6/2004 | Kawai et al. ........... 365/185.09 | | OTHER PUBLICATIONS | |
| 6,876,557 | B2 | 4/2005 | Hsu et al. ...................... 365/49 | | | |
| 2002/0033720 | A1* | 3/2002 | Ikehashi et al. ............. 327/143 | U.S. Appl. No. 60/405,379, filed Aug. 23, 2002, Pederson. | | |
| 2003/0016559 | A1* | 1/2003 | Kawai et al. ........... 365/185.12 | U.S. Appl. No. 60/248,894, filed Nov. 15, 2000, Pederson. | | |
| | | | | U.S. Appl. No. 09/957,027, filed Sep. 21, 2001. | | |

FOREIGN PATENT DOCUMENTS

EP        0 468 822 A2       7/1991

* cited by examiner

NON-VOLATILE SEMICONDUCTOR STORAGE DEVICE PERFORMING ROM READ OPERATION UPON POWER-ON

CROSS-REFERENCE TO RELATED APPLICATIONS

This is a continuation of application Ser. No. 10/648,853 filed Aug. 26, 2003 now U.S. Pat. No. 7,116,603, the entire contents of which are incorporated by reference. Also, this application is based upon and claims the benefit of priority under 35 U.S.C. § 119 from the prior Japanese Patent Application No. 2002-316350, filed Oct. 30, 2002, the entire contents of which are incorporated herein by reference.

BACKGROUND OF THE INVENTION

1. Field of the Invention

The present invention relates to a semiconductor storage device in which for example, redundancy addresses and data used to adjust the levels of various voltages generated inside chips are stored in memory cells as fuse data. Furthermore, the present invention relates to a non-volatile semiconductor storage device that reads the fuse data from the memory cells upon power-on.

2. Description of the Related Art

Semiconductor memories normally store, as fuse data, redundancy addresses and initial data required to adjust the levels of various voltages generated inside chips. Fuses that store fuse data include, for example, laser fuses that can be blown when irradiated with laser light, electric fuses that control a current conductive state by electrically breaking down a transistor or capacitor element, and ROM fuses that uses some memory cells as a fuse area. A ROM fuse is used for a non-volatile memory.

A non-volatile memory provided with a ROM fuse generates a power-on reset signal upon power-on. In response to the power-on reset signal, a reset operation is performed on all circuits inside chips which must be reset. Further, the fuse data stored in the ROM fuses are read and held by a latch circuit.

FIG. 1 shows variations in power voltage VCC and current consumption ICC in a non-volatile memory, in which a ROM read operation is performed to read the fuse data from ROM fuses and set it in a latch circuit. In the following example, in particular, a NAND flash memory will be described as a non-volatile memory.

When a power voltage VCC rises to reach a power-on detection level, a power-on detecting circuit outputs a power-on reset signal. The power-on reset signal is supplied to a ROM read control circuit. Furthermore, the ROM read control circuit outputs a ROM read activation signal to start a ROM read operation. The ROM read operation is exactly the same as a normal read operation except that an access region is a ROM fuse region and that the ROM read operation includes an operation of setting read ROM fuse data in a latch circuit of a peripheral logic circuit.

During a ROM read operation, current consumption has a large peak value during an initial stage of the read operation because bit lines must be precharged. Subsequently, during data set (latch), the current consumption has a uniform small value. That is, during a read operation, a large current of about several mA on the average flows because various voltage generating circuits operate including a booster circuit required for read operations. Once the read operation is completed, data sensed by a sense amplifier is transferred to the peripheral circuit, where it is latched. At this time, the booster circuit need not operate, thus reducing a value for current consumption.

The recent non-volatile memories are widely used as inexpensive mass memories partly because of the use of fine-grained elements. Thus, a plurality of, e.g. four or eight memory chips are accommodated in the same package.

In a non-volatile memory provided with a plurality of memory chips in this manner, when the power voltage rises, a power-on reset operation is performed concurrently in the individual memory chips. Accordingly, a ROM read operation for loading fuse data is performed concurrently in all memory chips. Subsequently, when a user inputs, for example, a read command to address a memory region of a particular memory chip, a normal read operation is performed.

The normal operation activated by a command input after the power-on reset operation does not create any problems because it is impossible that the plurality of chips operate simultaneously. However, with a ROM read operation, no external addresses are input, and the device is automatically activated upon power-on. Accordingly, a ROM read operation is started concurrently in the individual memory chips. Thus, if there are virtually no differences in power-on detection timing among the power-on detecting circuits in the individual memory chips, a ROM read operation is started concurrently in all memory chips. The current consumption during a ROM read operation increases simply by a factor of four or eight compared to a single memory chip.

That is, in the prior art, when a non-volatile memory is constructed using a plurality of memory chips, it consumes a large amount of current immediately after power-on. Accordingly, if the system does not have a sufficient power supply capability, a value for the power voltage may decrease. Thus, for a non-volatile memory using a plurality of memory chips, it is desirable to reduce current consumption immediately after power-on.

BRIEF SUMMARY OF THE INVENTION

According to an aspect of the present invention, there is provided a non-volatile semiconductor storage device comprises a ROM region which stores fuse data, at least one pad to which a signal is supplied, and a read control circuit connected to the ROM region and the at least one pad to receive a power voltage and control reading of fuse data from the ROM region after the power voltage has reached a predetermined level during a rise so as to control timing for activating an operation of reading the fuse data, according to the signal supplied to the at least one pad.

DETAILED DESCRIPTION OF THE INVENTION

Figure 1:
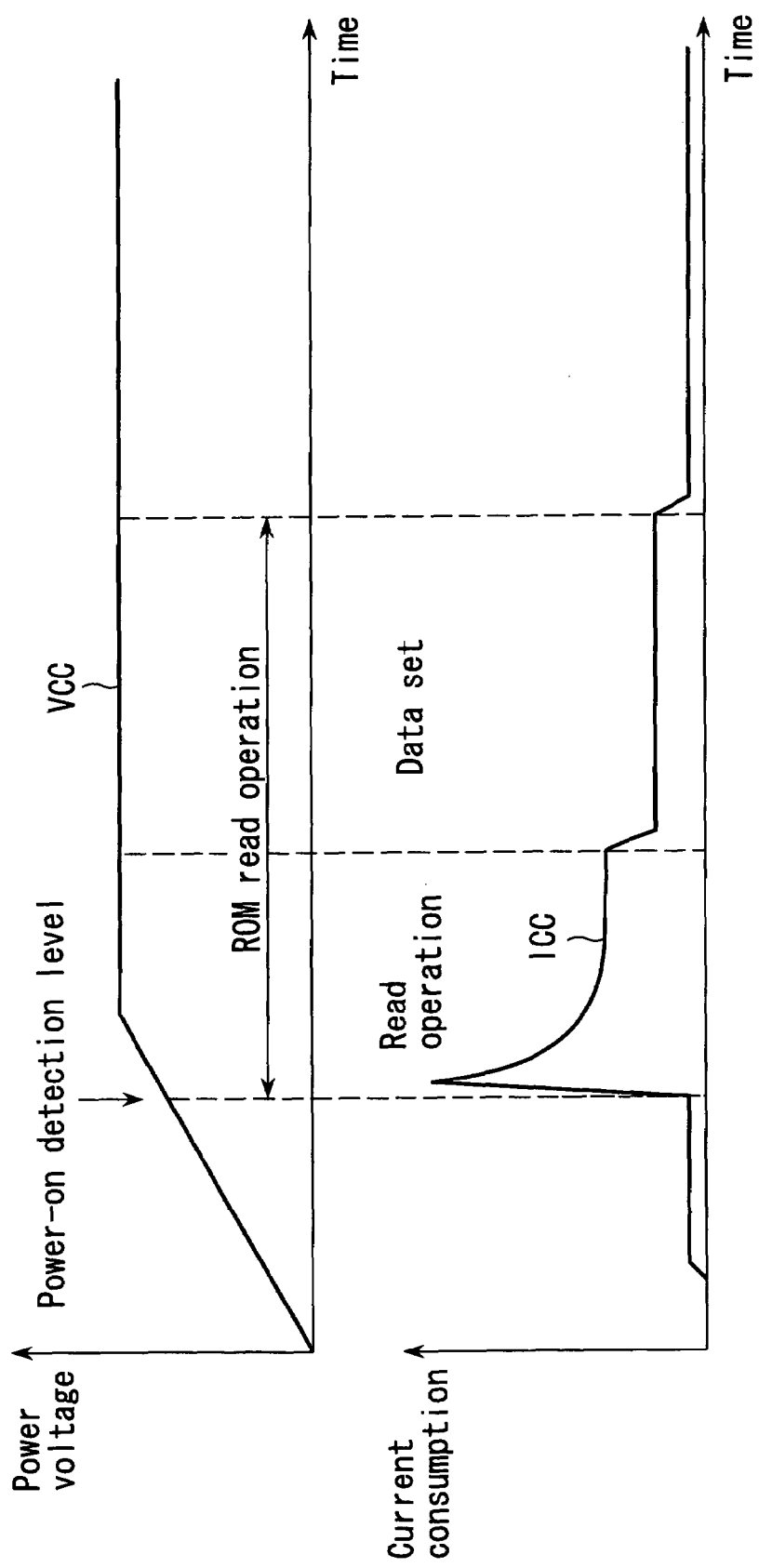
FIG. 1 is a waveform diagram showing variations in power voltage and current consumption in a non-volatile memory.

The present invention will be described below with reference to the drawings using its embodiments. Corresponding components are denoted by the same reference numerals throughout the drawings. Duplicate description is omitted.

(First Embodiment)

Figure 2:
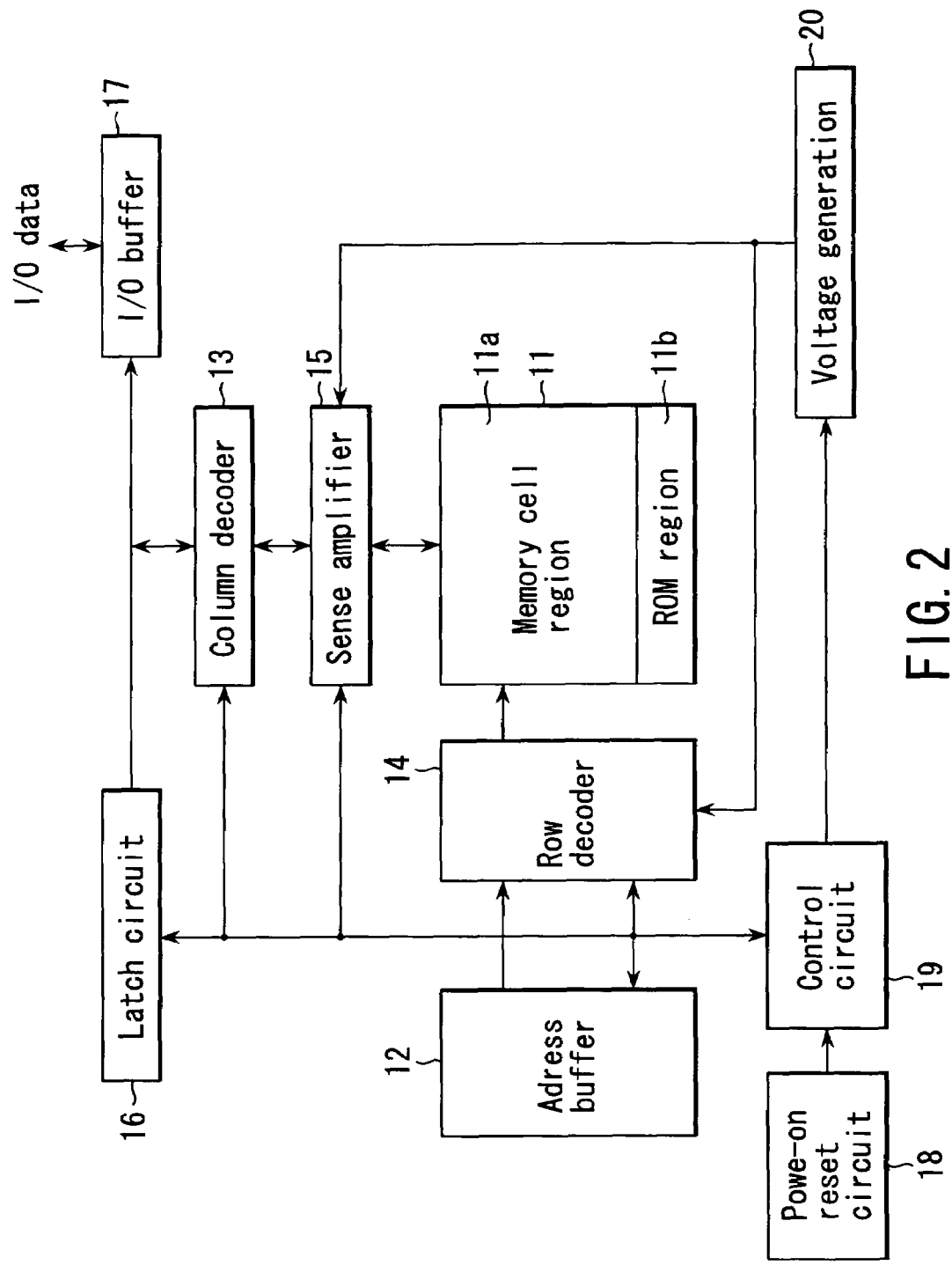
FIG. 2 is a circuit diagram showing the internal configuration of a non-volatile memory chip according to a first embodiment.
Figure 3:
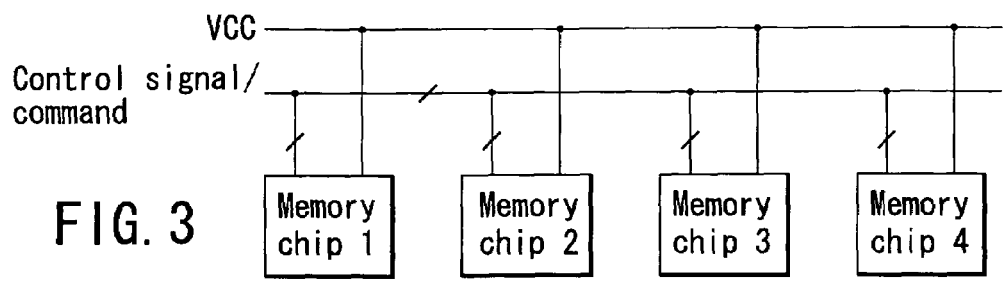
FIG. 3 is a circuit diagram of a non-volatile memory using a plurality of memory chips one of which is shown in FIG. 2.

FIG. 2 is a block diagram showing the internal configuration of a non-volatile memory chip according to a first embodiment. This figure shows the internal configuration of one memory chip in a non-volatile memory configured, for example, to accommodate a plurality of, e.g. four memory chips in the same package as shown in FIG. 3. Further, this figure shows a NAND flash memory chip.

Each chip is provided with a memory cell array 11, an address buffer 12, a column decoder 13, a row decoder 14, a sense amplifier 15, a latch circuit 16, an I/O buffer 17, a power-on reset circuit 18, a control circuit 19, a voltage generating circuit 20, and other circuits.

The memory cell array 11 has not only an ordinary memory cell region 11a that stores data but also a ROM region 11b that stores various data (fuse data) that must be read after power-on, such as replacement data used to replace defective cells present in the memory cell array 11 with other redundancy cells and trimming data used to adjust a timer and various voltage generators.

A column address input to the address buffer 12 is input to the column decoder 13 and then decoded by the decoder 13. A row address also input to the address buffer 12 is input to the row decoder 14 and then decoded by the decoder 14. On the basis of the specified addresses, data is written to a memory cell in the memory cell region 11a or is read from a memory cell. When data is read, the read data is output via the sense amplifier 15, the column decoder 13, and the I/O buffer 17. When data is written, write data is supplied to the memory array 11 through a path contrary to the one used for a read operation. Further, the fuse data stored in the ROM region 11b is transmitted to the latch circuit 16 via the sense amplifier 15 and the column decoder 13. The data is then held in the latch circuit 16.

The voltage generating circuit 20 uses an externally supplied power voltage VCC to generate various internal voltages such as a reference voltage VREF and a program voltage Vpg.

The power-on reset circuit 18 remains at an "L" level after the device has been powered on and before the power voltage reaches a predetermined voltage level. Once the predetermined voltage level has been reached, the power-on reset circuit 18 changes to an "H" level to generate a power-on reset signal. The power-on reset signal is input to the control circuit 19.

On the basis of the power-on reset signal, the control circuit 19 outputs control signals that initialize the address buffer 12, the column decoder 13, the row decoder 14, the sense amplifier 15, the latch circuit 16, and the voltage generating circuit 20, respectively.

Further, simultaneously with initialization of each of the above circuits, the control circuit 19 outputs a control signal used to provide control required to read the fuse data stored in the ROM region 11b and set it in the latch circuit 16. An operation of reading the fuse data stored in the ROM region 11b and setting it in the latch circuit 16 is called a "ROM read operation".

A mass non-volatile memory is constructed by using and accommodating a plurality of, e.g. four memory chips such as the one shown in FIG. 2, in the same package. In this case, as shown in FIG. 3, wires shared by the four memory chips are used to connect together a power pad (VCC), various pads used to input control signals or commands such as a power pad (VCC), /CE (chip enable signal), /WE (write enable signal), and /RE (read enable signal), and I/O pads.

Further, in addition to the above pads, each of the four pads is provided with two pads P0 and P1 used to receive an input 2-bit address CADD0, CADD1 that specifies a chip address. Voltages corresponding to each chip address are connected to the corresponding two chip-address-specifying pads by bonding wires. Different chip addresses are set for the respective memory chips depending on the voltages supplied to the two pads.

To externally access the individual memory chips, commands, addresses, and data are input and output as in the case with one memory chip. An address from an address space four times as large as that in the case with one memory chip is input to the memory chips. The plurality of memory chips simultaneously receive the address and individually determine which memory chip corresponds to the received address. Then, only the corresponding chip is operated.

Now, it is assumed that data is to be read. To perform a read operation, an external read command is input, and subsequently an address is input. If it is assumed that each memory chip is internally provided with 1K (=1,024) word lines, a 10-bit row address is input because 1,024 is the 10th power of 2. However, since it is assumed that the memory is provided with four memory chips, the address space is four times as large as that in the case with one memory chip. Consequently, 4K row addresses are provided, so that an address is represented by 10+2=12 bits. The added two bits indicate a chip address. Accordingly, the input 2-bit row address is compared with the 2-bit chip address CADD0, CADD1, determined by bonding, to enable operations of the memory chip for which these addresses match each other. Then, although the memory is provided with the plurality of memory chips, it appears that one memory chip having a quadruple memory capacity is operating if the package is viewed from the outside.

The number of chip address specifying pads is not limited to two. For example, if eight memory chips are accommodated in the same package, three chip address specifying pads are provided. If 16 memory chips are accommodated in the same package, four chip address specifying pads are provided.

Figure 4:
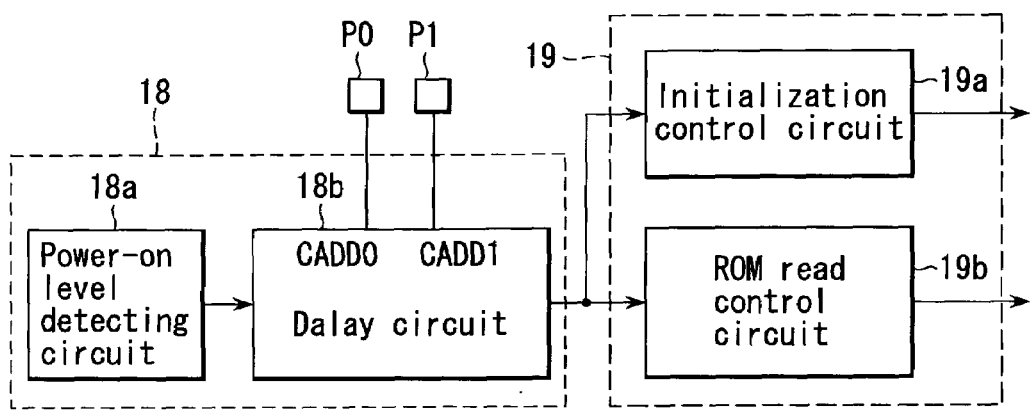
FIG. 4 is a block diagram showing the internal configuration of a power-on reset circuit and a control circuit in the memory chip shown in FIG. 2.

FIG. 4 shows the internal configuration of the power-on reset circuit 18 and the control circuit 19 in each memory chip of a non-volatile memory in which four memory chips are accommodated in the same package as shown in FIG. 3.

The power-on reset circuit 18 is composed of a power-on level detecting circuit 18a and a delay circuit 18b. The power-on level detecting circuit 18a detects the power voltage to output a power-on reset signal. The delay circuit 18b delays the power-on reset signal.

The two chip address specifying pads P0 and P1 are connected to the delay circuit 18a. The delay circuit 18b has its delay time controlled according to the chip address bits CADD0 and CADD1 supplied to these two pads, respectively.

The power-on reset signal is delayed in order to ensure the time required to stabilize the operations of a constant current circuit, a reference voltage circuit, and others provided in the chip after power-on. The delay operation is required particularly if the power supply starts up at high speed.

The control circuit 19 is composed of an initialization control circuit 19a that outputs a control signal for initializing the internal state of each of the address buffer 12, the column decoder 13, the row decoder 14, the sense amplifier 15, the latch circuit 16, and the voltage generating circuit 20, and a ROM read control circuit 19b that outputs a control signal for controlling a ROM read operation.

Table 1 shows an example of the chip address bits CADD0 and CADD1 supplied to the two chip address specifying pads P0 and P1, respectively, of each of the four memory chips, as well as the delay time in the delay circuit 18b.

| Chip No. | CADD0 | CADD1 | Delay time |
|---|---|---|---|
| 1 | "L" | "L" | t1 µs |
| 2 | "L" | "H" | t2 µs |
| 3 | "H" | "L" | t3 µs |
| 4 | "H" | "H" | t4 µs |

Table 1 shows that the chip address (CADD0, CADD1) and the delay time are set at ("L", "L") and t1 µs, respectively, for the memory chip 1, ("L", "H") and t2 µs, respectively, for the memory chip 2, ("H", "L") and t3 µs, respectively, for the memory chip 3, and ("H", "H") and t4 µs, respectively, for the memory chip 4. However, the relationship t1<t2<t3<t4 is established for the time t1 to t4.

Figure 5:
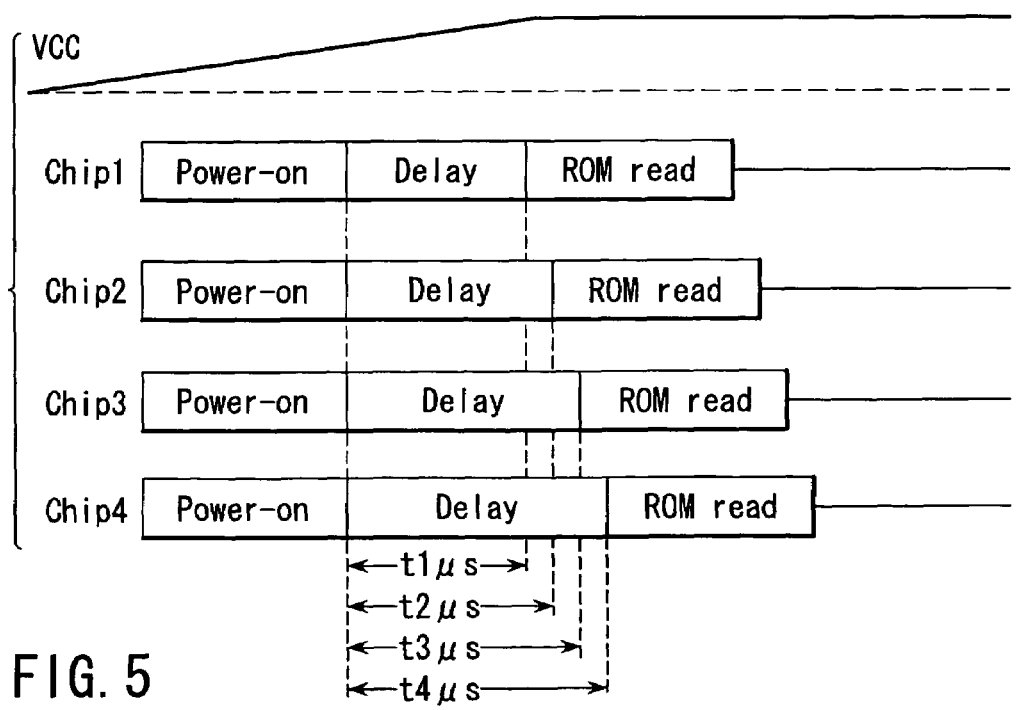
FIG. 5 is a timing chart showing an example of an operation performed by the non-volatile memory shown in FIG. 3.

Now, operations of the non-volatile memory configured as described above will be described with reference to the timing chart in FIG. 5.

When the power voltage VCC rises and its value reaches a power-on detection level, the power-on level detecting circuit 18a in each memory chip outputs a power-on reset signal. FIG. 5 shows the power-on reset period in which the power-on reset signal remains at the "L" level, as "power-on". Further, in FIG. 5, there is no differences among the four memory chips during the power-on reset period. Subsequently, the power-on reset signal is delayed a predetermined time by the delay circuit 18b. FIG. 5 shows the delay period as "Delay". In this case, the delay time in the delay circuit 18b is controlled by the 2-bit signal supplied to the pads for the chip address CADD0, CADD1. Timing for clearing the resetting of the delayed power-on reset signal is sequentially shifted among the chips. Once the delay period ends, the ROM read control circuit 19b outputs a control signal that controls a ROM read operation, to activate a ROM read operation.

In this case, the delay time in the delay circuit 18b is sequentially shifted among the memory chips. That is, it is set at t1 µs for the memory chip 1, t2 µs for the memory chip 2, t3 µs for the memory chip 3, and t4 µs for the memory chip 4. Accordingly, timing for activating a ROM read operation is sequentially shifted among the four memory chips. Thus, the timing with which the value for the current consumption of a ROM read operation exhibits a peak varies among the individual chips. This prevents the current consumption from increasing immediately after power-on if a plurality of non-volatile memory chips are used. This in turn eliminates the possibility of reducing the power voltage immediately after power-on, thus avoiding degradation of the power supply capability of the system.

Figure 6A:
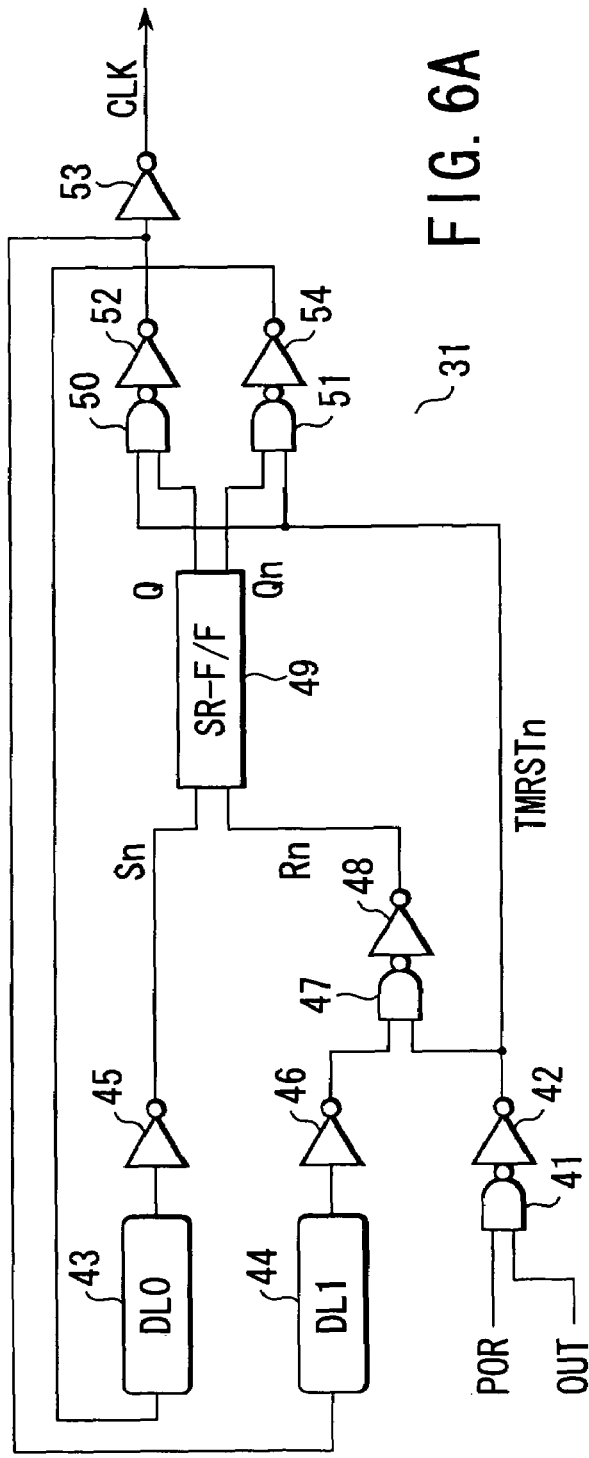
FIGS. 6A and 6B are circuit diagrams showing an example of a detailed configuration of a delay circuit in FIG. 4.
Figure 6B:
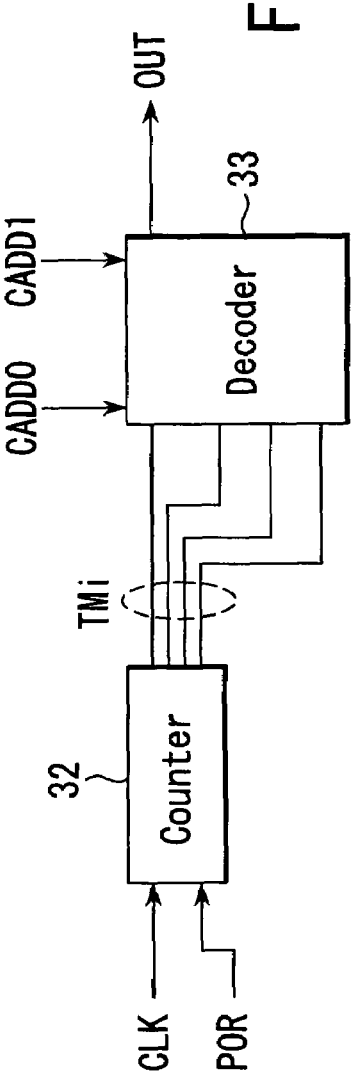

FIGS. 6A and 6B show an example of a detailed configuration of the delay circuit 18b in FIG. 3. The delay circuit 18b is composed of a clock signal generating circuit 31, shown in FIG. 6A, and a counter circuit 32 and a decoder circuit 33, both of which are shown in FIG. 6B.

The clock signal generating circuit 31 receives a power-on reset signal POR output by the power-on level detecting circuit 18a in FIG. 3 and an output signal OUT from the decoder circuit 33. The clock signal generating circuit 31 starts operations after the power-on reset signal POR changes to the "H" level, to generate a clock signal CLK for a specified period. It stops operations after the signal OUT changes to the "H" level.

Specifically, the clock signal generating circuit 31 is configured as follows:

A NAND gate 41 is supplied with the power-on reset signal POR and the output signal OUT from the decoder circuit 33. An output signal from the NAND gate 41 is inverted by an inverter circuit 42. Delay circuits 43 and 44 have delay times DL0 and DL1, respectively. Output signals from the delay circuits 43 and 44 are inverted by inverter circuits 45 and 46, respectively. Output signals from the inverter circuits 42 and 46 are supplied to a NAND gate 47. An output signal from the NAND gate 47 is supplied to a reset input terminal Rn of an SR-type flip flop circuit (SR-F/F) 49 via an inverter circuit 48. An output signal from the inverter circuit 45 is supplied to a set input terminal Sn of the flip flop circuit 49. A signal from a Q output terminal of the flip flop circuit 49 is supplied to a NAND gate 50 together with an output signal TMRSTn from the inverter circuit 42. A signal from a Qn terminal is supplied to a NAND gate 51 together with the signal TMRSTn. An output signal from the NAND gate 50 is supplied to the delay circuit 44 and an inverter circuit 53 via an inverter circuit 52. An output signal from the NAND gate 51 is supplied to the delay circuit 43 via an inverter circuit 54. Then, a clock signal CLK is output by the inverter circuit 53.

The clock signal generating circuit 31 configured as described above operates as follows: It is assumed that the output signal OUT from the decoder circuit 33 remains at the "H" level before the power-on reset signal POR changes to the "H" level. Then, when the signal POR changes to the "H" level, the output signal from the NAND gage 41 and the signal TMRSTn change to the "L" and "H" levels, respectively, to open the NAND gate 47, 50, and 51.

Further, the output signals from the delay circuit 44 and the inverter circuit 46 remain at the "L" and "H" levels, respectively, before the power-on reset signal POR changes to the "H" level. Accordingly, the output signal from the inverter circuit 48 changes to the "L" level to reset the flip flop circuit 49.

This reset operation changes the signal from the Q output terminal to the "L" level, while changing the signal from the Qn output terminal to the "H" level. In this state, the signal POR changes to the "H" level, while the signal TMRSTs changes to the "H" level. Thus, the NAND gate 51 is opened to input the "H" level signal to the delay circuit 43 via the NAND gate 51 and the inverter circuit 54. Then, once the delay time DL0 in the delay circuit 43 has elapsed, the flip flop circuit 49 is set. Thus, the signal from the Q output terminal is inverted to the "H" level, while the signal from the Qn output terminal is inverted to the "L" level. Subsequently, the "H" level signal is input to the delay circuit 44 via the NAND gate 50 and the inverter circuit 52. Then, once the delay time DL1 in the delay circuit 44 has elapsed, the flip flop circuit 49 is reset. Thus, the signal from the Q output terminal is inverted to the "L" level, while the signal from the Qn output terminal is inverted to the "H" level. Subsequently, similar operations are repeated until the signal OUT changes to the "L" level. Thus, the inverter circuit 53 outputs a clock signal CLK for which one period equals (DL0+ DL1).

When the signal OUT changes to the "L" level, the output signal from the NAND gate 41 changes to the "H" level, while the signal TMRSTn changes to the "L" level. Thus, the NAND gates 47, 50, and 51 are closed to preclude the clock signal CLK from being output.

The counter circuit 32 starts operations after the power-on reset signal POR has changed to the "H" level. It counts the clock signal CLK in a frequency dividing manner to output a count signal TMi composed of a plurality of bits (i bits) consisting of binary numbers.

The decoder circuit 33 compares the count signal TMi output by the counter circuit 32 with the 2-bit chip address CADD0, CADD1. The decoder circuit 33 then inverts the output signal OUT, which is initially at the "H" level, to the "L" level after both values have met a predetermined relationship.

Figure 7:
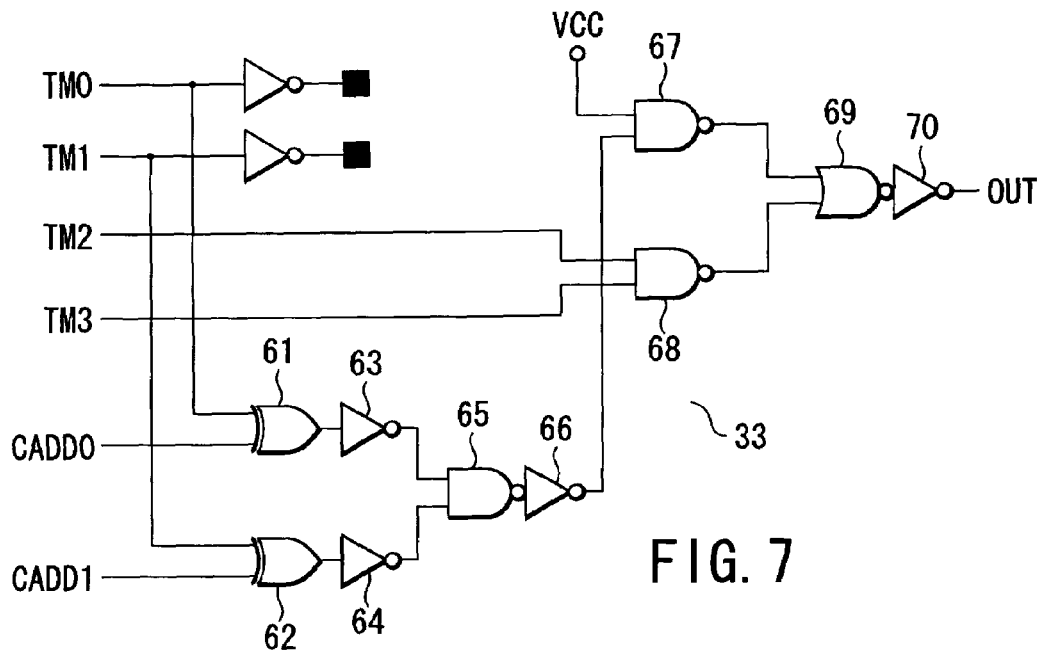
FIG. 7 is a circuit diagram specifically showing a decoder circuit in FIG. 6.

FIG. 7 shows a specific example of the decoder circuit 33. In this example, the decoder circuit 33 inverts the output signal OUT to the "L" level after the counter circuit 32 has counted clock signals CLK up to an arbitrary number between 12 and 15.

The least significant bit of the count signal TMi (in this example, four bits TM0 to TM3) from the counter circuit 32 is supplied to an exclusive OR gate 61 together with the lower bit chip address CADD0. Likewise, the count signal TM1, which is one bit higher than the signal TM0, is supplied to an exclusive OR gate 62 together with the higher bit chip address CADD. Output signals from the exclusive OR gates 61 and 62 are supplied to a NAND gate 65 via inverter circuits 63 and 64, respectively. Furthermore, an output signal from the NAND gate 65 is supplied to one of the input terminals of a NAND gate 67 via an inverter circuit 66. The power voltage VCC is supplied to the other input terminal of the NAND gate 67. The count signals TM2 and TM3, which are higher than the signal TM1, are both supplied to a NAND gate 68. The output signals from the NAND gates 67 and 68 are supplied to a NOR gate 69. Then, an output signal OUT is output by an inverter circuit 70 that inverts an output signal from the NOR gate 69.

With the decoder circuit 33 configured as described above, provided that the chip address bits CADD0 and CADD1 are both set at, for example, the "L" level, the output signal OUT is inverted to the "L" level when the count signals (TM0, TM1, TM2, and TM3) are set to ("L", "L", "H", "H"), i.e. after the counter circuit 32 has counted 12 clock signals CLK. Further, in this state, as a value for the combination of the chip address bits CADD0 and CADD1 increments by ones according to the decimal scale, the number of clock signals CLK increments by ones with which the output signal OUT is inverted to the "L" level after the counter circuit 32 has counted the predetermined number of clock signals CLK.

In this case, it is assumed that the clock signal CLK has a basic period of 2 μs and that the chip address CADD0, CADD1 is set so that the count in the counter circuit 32 with which the output signal OUT from the decoder circuit 33 is inverted to the "L" level is 12 for the memory chip 1, 13 for the memory chip 2, 14 for the memory chip 3, and 15 for the memory chip 4. In FIGS. 4 and 5, delay time t1 is 24 μs, delay time t2 is 26 μs, delay time t3 is 28 μs, and delay time t4 is 30 μs.

Figure 8:
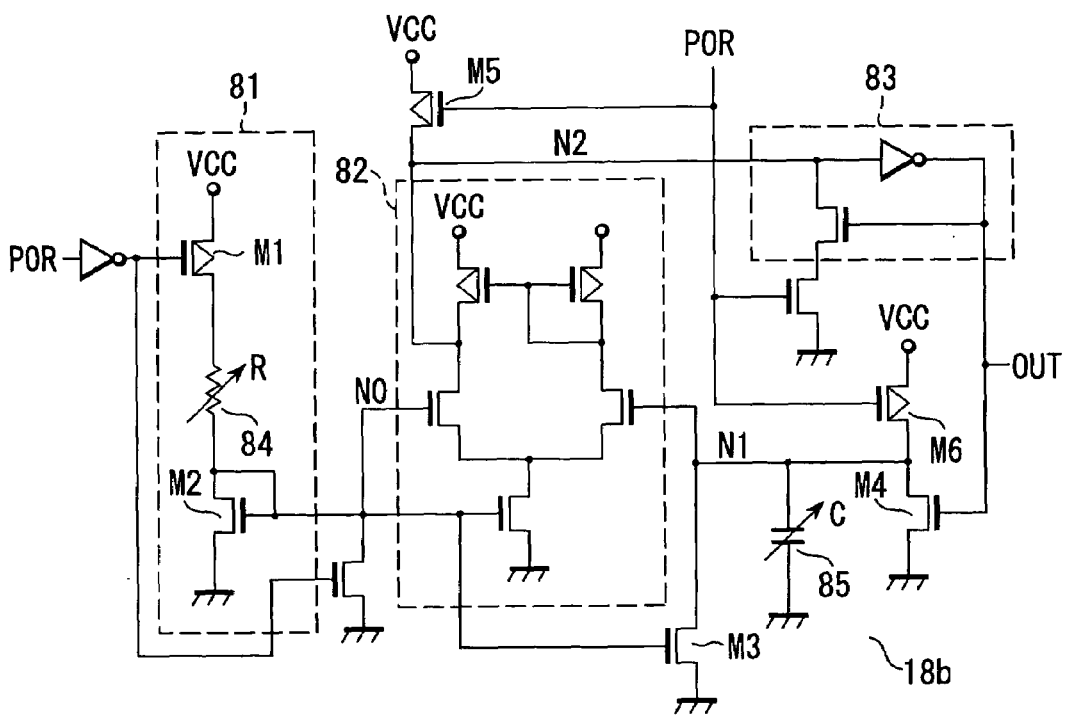
FIG. 8 is a circuit diagram showing another detailed configuration of the delay circuit in FIG. 4.
Figure 9:
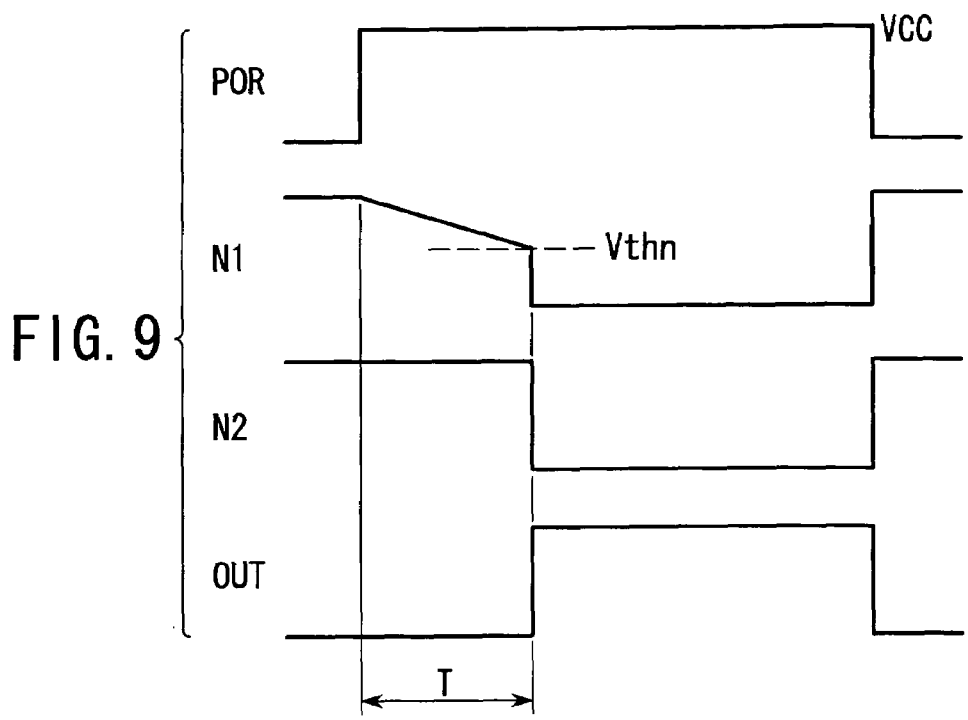
FIG. 9 is a diagram showing the forms of waves generated in essential parts of the delay circuit shown in FIG. 8.

FIG. 8 shows an example of another detailed configuration of the delay circuit 18b in FIG. 3. This delay circuit is composed of a constant current circuit 81, an operational amplifier 82, a latch circuit 83, and other circuits. The delay circuit 18b may be the one disclosed in, for example, Jpn. Pat. Appln. KOKAI Publication No. 8-190798. Further, FIG. 9 shows the forms of waves generated in essential parts of the delay circuit shown in FIG. 8.

When the power-on reset signal POR changes to the "H" level, a PMOS transistor M1 in the constant current circuit 81 is turned on to conduct a constant current Iref through an NMOS transistor M2 via a variable resistance circuit 84. The constant current Iref is mirrored by an NMOS transistor M3 having a gate connected to a gate of the NMOS transistor M2. The constant current Iref causes charges already stored in a variable capacitor circuit 85 to be released. A node N1 at one terminal of the variable capacitor circuit 85 is connected to one of the input nodes of the operational amplifier 82. This discharge reduces the potential at the node N1. Then, the operational amplifier 82 detects that the potential at the node N1 has decreased below the potential at a node N0, the other input node of the operational amplifier 82. This detection result is latched by the latch circuit 83. That is, the output signal OUT changes to the "H" level a predetermined time after the power-on reset signal POR has changed to the "H" level.

When the output signal OUT changes to the "H" level, an NMOS transistor M4 connected to the node N1 is turned on to emit all charges from the variable capacitor circuit 85.

When the power-on reset signal POR changes to the "L" level, the delay circuit 18*b* is reset to immediately change the output signal OUT to the "L" level. That is, a PMOS transistor M5 connected to an input node N2 of the latch circuit 83 is turned on to provide the power voltage VCC to the node N2. Then, the signal OUT, the output signal from the latch circuit 83, changes to the "L" level. Further, a PMOS transistor M6 connected to the node N1 is turned on to start charging the variable capacitor circuit 85 via the PMOS transistor M6.

In this manner, the delay circuit shown in FIG. 8 operates as a unidirectional type that delays the power-on reset signal POR only when the signal POR rises to the "H" level. When the threshold voltage of the NMOS transistor M2 and the resistance value of the variable resistance circuit 84 are defined as Vthn and R, respectively, a value for the constant current Iref is given by:

$$Iref=(VCC-Vthn)/R \quad (1)$$

On the other hand, when the delay time from the start of discharging of the variable capacitor circuit 85 until the potential at the node N1 becomes equal to the potential Vthn at the node N0 is defined as T, and the capacitance value of the variable capacitor circuit 85 is defined as C, the following equation is established:

$$Iref \cdot T=(VCC-Vthn) \cdot C \quad (2)$$

Then, when Equation (1) is substituted into Equation (2), T=R·C is obtained.

Therefore, the delay time T can be controlled by changing one or both of the resistance value R of the variable resistance circuit 84 and the capacitance value C of the variable capacitor circuit 85 according to the 2-bit chip address CADD0, CADD1.

Now, description will be given of an example of a specific configuration of the variable resistance circuit 84 and the variable capacitor circuit 85.

Figure 10A:
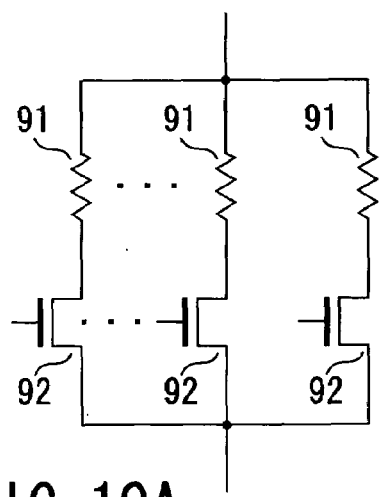
FIGS. 10A and 10B are circuit diagrams showing specific configurations of a variable resistance circuit in FIG. 8.
Figure 10B:
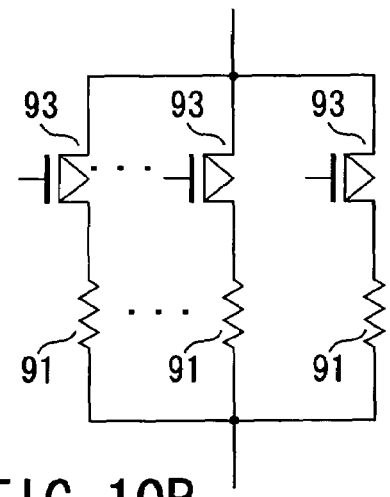

FIGS. 10A and 10B show different examples of the variable resistance circuit 84. The variable resistance circuit shown in FIG. 10A is configured so that a required number of series circuits are connected together in parallel each of which is composed of a resistor 91 and an NMOS transistor 92. The variable resistance circuit shown in FIG. 10B differs from the one shown in FIG. 10A in that a PMOS transistor 93 is used in place of the NMOS transistor 92.

With the variable resistance circuit configured as described above, the resistance value R can be controlled by changing the number of NMOS transistors 92 or PMOS transistors 93 that are simultaneously turned on according to the 2-bit address CADD0, CADD1 or changing the resistance value of the resistor 91 and then selectively turning the NMOS transistor 92 or the PMOS transistor 93 on.

Figure 11:
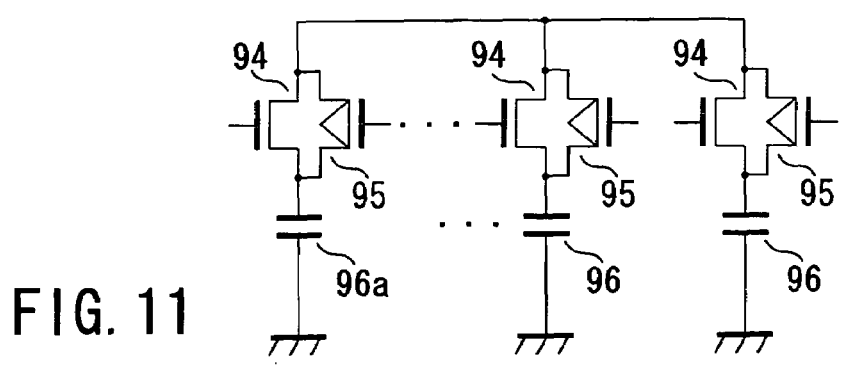
FIG. 11 is a circuit diagram showing a specific configuration of a variable capacitor circuit in FIG. 8.

FIG. 11 shows an example of a specific configuration of the variable capacitor circuit 85. This variable capacitor circuit is configured so that a required number of parallel circuits are connected together in parallel each of which includes a capacitor 96 connected in series with a CMOS transfer gate including an NMOS transistor 94 and a PMOS transistor 95 connected together in parallel.

With the variable capacitor circuit configured as described above, the capacitance value C can be controlled by changing the number of CMOS transfer gates that are simultaneously turned on according to the 2-bit address CADD0, CADD1 or changing the capacitance of the capacitor 96 and then selectively turning the CMOS transfer gate on.

The delay circuits 43 and 44 in FIG. 6 may be constituted by providing a resistance circuit and a capacitor circuit each having a fixed value in place of the variable resistance circuit 84 and variable capacitor circuit 85 in the delay circuit shown in FIG. 8.

Alternatively, instead of the delay circuit shown in FIG. 6 or 8, a common simple delay circuit composed of an inverter circuit, a resistor, and a capacitor may be used with values for the resistor and the capacitor or the size of the inverter circuit controlled according to the chip address.

(Second Embodiment)

Now, a second embodiment of the present invention will be described.

Figure 12:
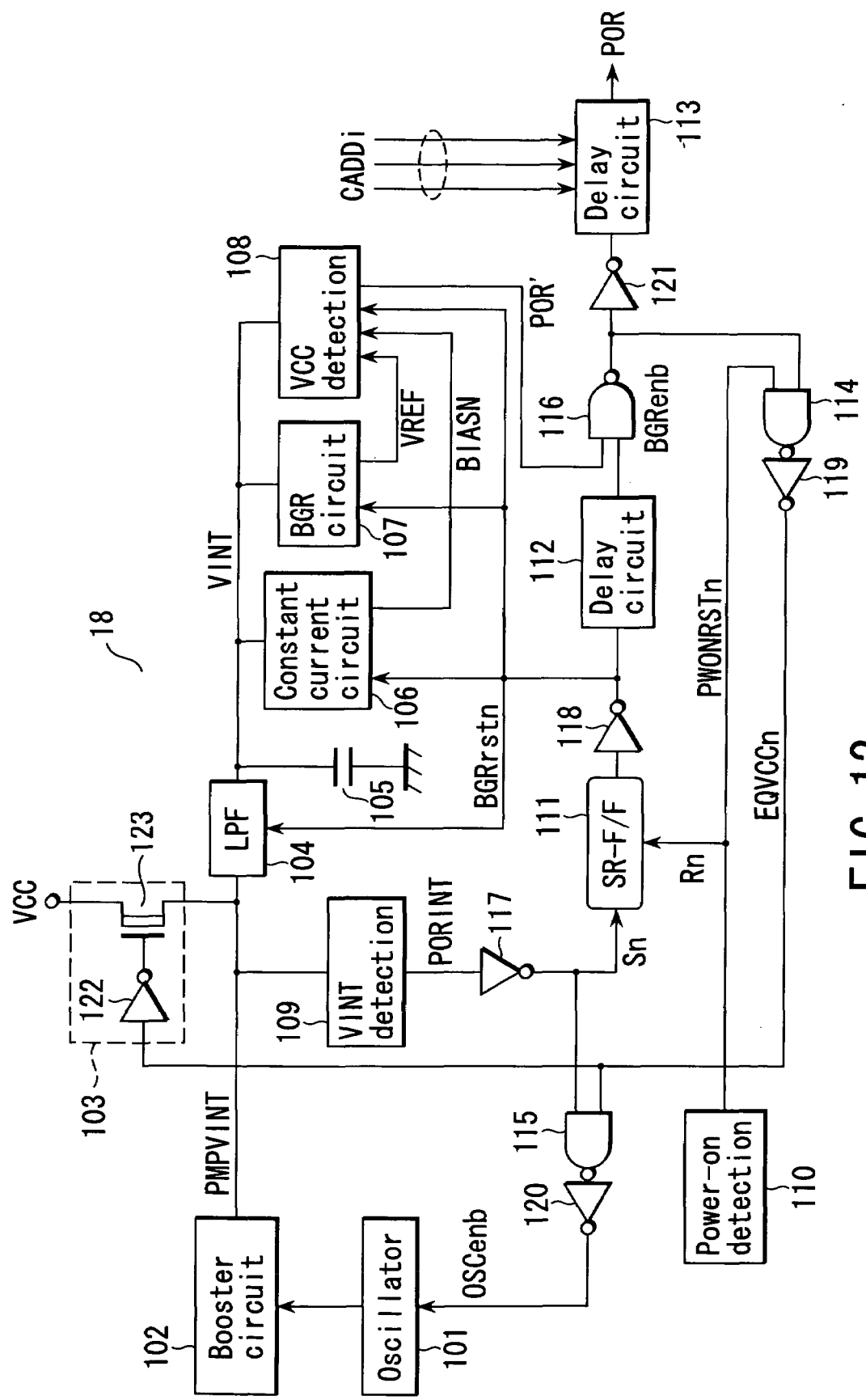
FIG. 12 is a block diagram showing a detailed configuration of a power-on reset circuit according to a second embodiment.

FIG. 12 shows a detailed configuration of the power-on reset circuit 18 in FIG. 1. This power-on reset circuit includes a circuit that uses the power voltage VCC as a power supply, and a circuit that uses as a power supply a boosted voltage VINT obtained by boosting the power voltage VCC.

An oscillating circuit (oscillator) 101, a booster circuit 102, a VINT-VCC short circuit 103, and other circuits operate using the power voltage VCC as a power supply.

The booster circuit 102 outputs a boosted voltage PMPVINT higher than the power voltage VCC. A low pass filter (LPF) 104 and a boosted voltage stabilizing capacitance 105 are provided at an output of the booster circuit 102.

The low pass filter 104 is composed of, for example, a resistor and a capacitor to hinder fluctuations in the potential of the boosted voltage PMPVINT to smooth this voltage.

The capacitance 105 hinders fluctuations in boosted voltage VINT and stores the boosted potential.

The boosted voltage VINT is supplied to a constant current circuit 106, a reference voltage circuit (BGR) 107, and a VCC detecting circuit 108 as a power supply.

A VINT detecting circuit 109 monitors the voltage PMPVINT and detects that a value for the voltage has reached a certain voltage level to generate a power-on detection signal PORINT. The power-on detection signal PORINT is used to control operations of the constant current circuit 106, the reference voltage circuit 107, the VCC detecting circuit 108, and other circuits.

A biasing constant voltage BIASN generated by the constant current circuit 106 is supplied to the VCC detecting circuit 108 and to the other circuits in FIG. 1.

The reference voltage circuit 107 operates using the boosted voltage VINT as a power supply, to generate a reference voltage VREF. The reference voltage VREF is supplied to the VCC detecting circuit 108 and to the other circuits in FIG. 1.

The VCC detecting circuit 108 monitors the voltage VCC and compares the voltage VCC with the reference voltage VREF to detect that the voltage VCC has reached a predetermined value certain voltage. The VCC detecting circuit 108 then generates a power-on reset signal POR'. The power-on reset signal POR' is supplied to the oscillating circuit 101, the VINT-VCC short circuit 103, and other circuits.

The oscillating circuit 101 starts an oscillating operation to generate a clock pulse when a power-on detecting circuit 110, described later, detects that the VCC power supply has started up, to output a signal PWONRST$_n$. The oscillating circuit 101 stops the oscillating operation when the power-on reset signal POR' output by the VCC detecting circuit 108 changes to the "H" level.

The booster circuit 102 performs a boosting operation in response to a clock pulse to generate a boosted voltage PMPVINT from the voltage VCC. Thus, the power voltage for the constant current circuit 106 and the reference voltage circuit 107 can be maintained at a certain high voltage level.

Furthermore, the power-on reset circuit shown in FIG. 12 is provided with the power-on detecting circuit 110, an SR-type flip flop circuit 111, delay circuits 112 and 113, three NAND gates 11 to 116, and four inverter circuits 117 to 121.

The power-on detecting circuit 110 detects that the power voltage VCC has reached a predetermined value or larger after power-on to generate a power-on detection signal PWONRST$_n$. The detection level of the power-on detecting circuit 110 is lower than that of the VCC detecting circuit 108. The power-on detection signal PWONRST$_n$ is supplied to a reset input terminal Rn of the flip flop circuit 111 and to the NAND gate 114.

The power-on detection signal PORINT generated by the VINT detecting circuit 109 is supplied to a set input terminal Sn of the flip flop circuit 111 and the NAND gate 115 via the inverter circuit 117. An output signal from the flip flop circuit 111 is supplied to the inverter circuit 118. An output signal BGRrstn from the inverter circuit 118 is supplied to the low pass filter 104, the constant current circuit 106, the reference voltage circuit 107, and the VCC detecting circuit 108 as a reset signal and is also supplied to the delay circuit 112. The delay circuit 112 delays the signal BGRrstn a specified time. An output signal BGRenb from the delay circuit 112 is supplied to the NAND gate 116 together with the power-on reset signal POR'. An output signal from the NAND gate 116 is supplied to the delay circuit 113 via the inverter circuit 121 and to the NAND gate 114. An output signal from the NAND gate 114 is supplied to the inverter circuit 119. An output signal EQVCC$_n$ from the inverter circuit 119 is supplied to the NAND gate 115 and to the VINT-VCC short circuit 103. An output signal from the NAND gate 115 is supplied to the inverter circuit 120. An output signal from the inverter circuit 120 is supplied to the oscillating circuit 101 as a signal OSCenb that controls an oscillating operation.

The VINT-VCC short circuit 103 is composed of an inverter circuit 122 to which the signal EQVCC$_n$ is input, and a D type MOS transistor 123 in which the output signal from the inverter circuit 122 is supplied to its gate and in which a current passage between its source and drain is interposed between the VCC node and the PMPVINT node.

The power-on reset signal shown in FIG. 12 operates as follows: The power-on detecting circuit 110 detects a minimum voltage VCCmin required to operate a logic circuit composed of the delay circuits 112 and 113, the NAND gates 114 to 116, the inverter circuits 117 to 122, and other circuits. Then, the voltage VINT starts to boost, which is used by an analog circuit composed of the constant current circuit 106, the reference voltage circuit 107, the VCC detecting circuit 108, and others. When the VINT detecting circuit 109 detects that the VINT level has exceeded the voltage VCCmin in the analog circuit, the signal BGRrstn clears a reset state of the constant current circuit 106, reference voltage circuit 107, and VCC detecting circuit 108. Subsequently, the power-on reset circuit waits for the delay time in the delay circuit 112 until the outputs (BIASN and VREF) from the analog circuit is stabilized. After values for the constant current generated by the constant current circuit 106 and for the reference voltage generated by the reference voltage circuit 107 have been stabilized, the VCC detecting circuit 108 detects the voltage VCC to clear the power-on reset signal POR' (clear the resetting).

After the signal POR' has been cleared, the signal OSCenb is inactivated on a path composed of the NAND gate 114, the inverter circuit 119, the NAND gate 115, and the inverter circuit 120. The oscillating circuit 101 stops its oscillating operation to stop the boosting operation of the booster circuit 102. Furthermore, the output signal EQVCC$_n$ from the inverter 119 turns on the MOS transistor 122 in the VINT-VCC short circuit 103 to short-circuit the voltages VINT and VCC. Moreover, to avoid the adverse effects of fluctuations in voltage caused by the short circuit between the voltages VINT and VCC, the reset state of the power-on reset signal POR is cleared after the delay time in the delay circuit 113. The power-on reset signal POR is input to the control circuit 19 in FIG. 1 to activate a ROM read operation.

In this case, the delay circuit 113, which outputs a power-on reset signal POR, is configured so that its delay time varies depending on a chip address CADDi consisting of a plurality of bits and supplied to a plurality of pads.

Accordingly, timing for clearing the power-on reset signal POR can be varied depending on the chip address by providing a plurality of memory chips each provided with the power-on reset circuit shown in FIG. 12 and assigning different chip addresses CADDi to the individual chips. As a result, timing for activating a ROM read operation is sequentially shifted among the memory chips. This prevents current consumption from increasing immediately after power-on if a plurality of non-volatile memory chips are used, as in the case with the first embodiment.

The delay circuit 113 that can have its delay time controlled can be configured as shown in FIG. 6 or 8.

(Third Embodiment)

Now, a third embodiment of the present invention will be described.

Figure 13:
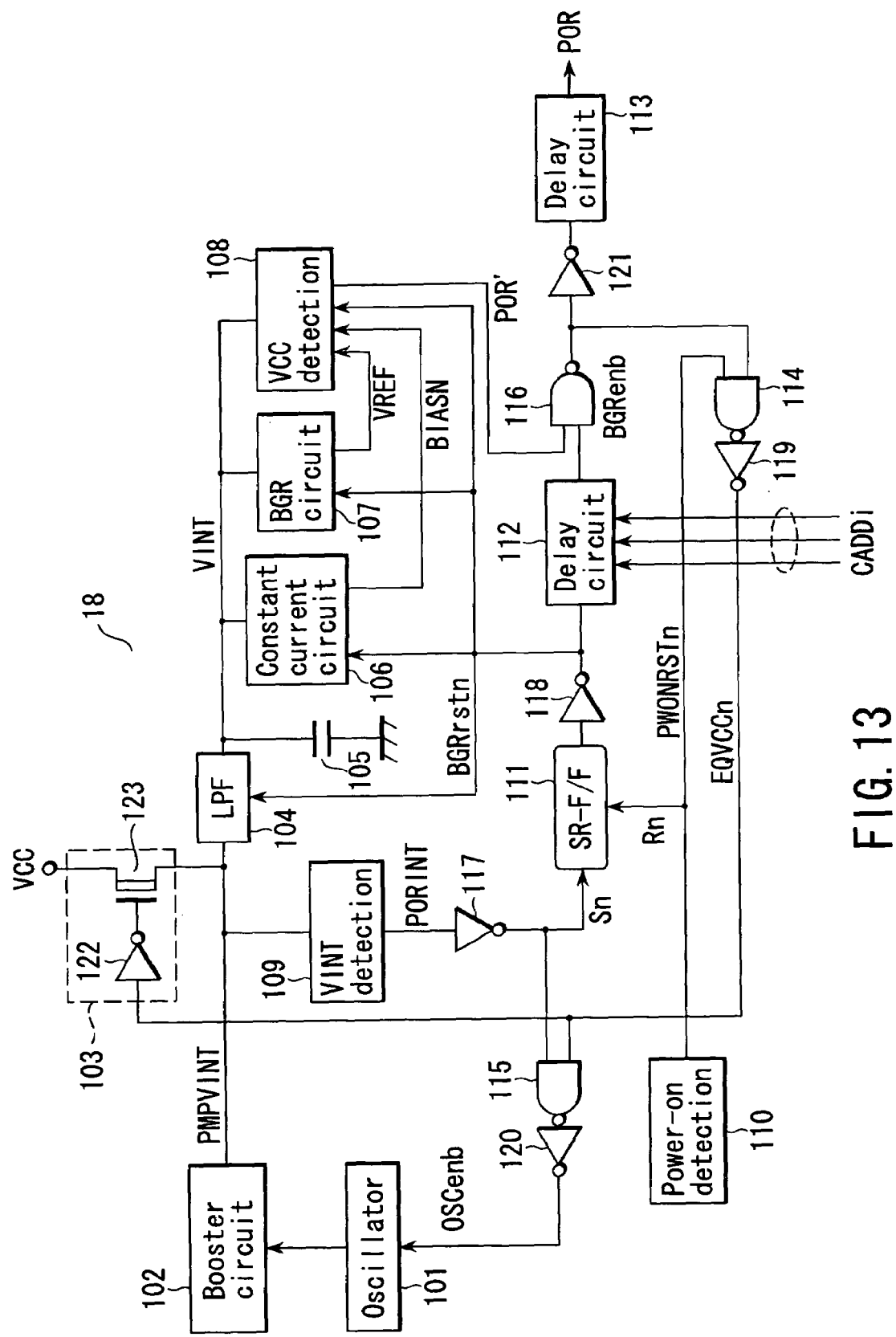
FIG. 13 is a circuit diagram showing a detailed configuration of a power-on reset circuit according to a third embodiment.

FIG. 13 shows a detailed configuration of the power-on reset circuit 18 in FIG. 2. The configuration of this power-on reset circuit differs only partly from that shown in FIG. 12. Thus, only this difference will be described, and description of points corresponding to FIG. 12 is omitted.

In the power-on reset circuit shown in FIG. 12, the delay time in the delay circuit 113 is varied depending on the chip address CADDi. However, in this embodiment, the delay time in the delay circuit 112, which delays the signal BGRrstn, is varied depending on the chip address CADDi.

With this configuration, even if the VCC detecting circuit 108 detects the voltage VCC to clear the reset state of the power-on reset signal POR', the output signal from the NAND gate 116 does not change to the "H" level unless the output signal BGRenb from the delay circuit 112 changes to the "H" level.

That is, also in the third embodiment, timing for clearing the reset state of the power-on reset signal POR varies depending on the chip address CADDi.

Consequently, timing for clearing the power-on reset signal POR can be varied depending on the chip address by providing a plurality of memory chips each provided with the power-on reset circuit shown in FIG. 13 and assigning different chip addresses CADDi to the individual chips. As a result, timing for activating a ROM read operation is sequentially shifted among the memory chips. This prevents current consumption from increasing immediately after power-on if a plurality of non-volatile memory chips are used, as in the case with the second embodiment.

In the third embodiment, the delay time in the delay circuit 112 is controlled, which outputs a signal BGRenb supplied to the NAND gate 116 together with the power-on reset signal POR'. Consequently, the embodiment is particularly effective if the power supply starts up at high speed.

Also in this case, the delay circuit 112 that can have its delay time controlled can be configured as shown in FIG. 6 or 8.

Figure 14:
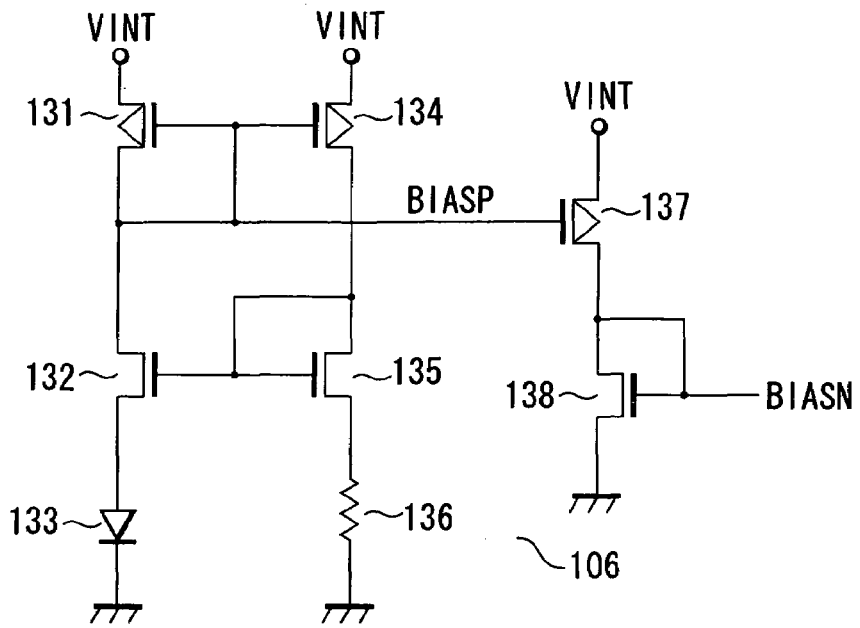
FIG. 14 is a circuit diagram showing a detailed configuration of a constant current circuit in FIGS. 12 and 13.
Figure 15:
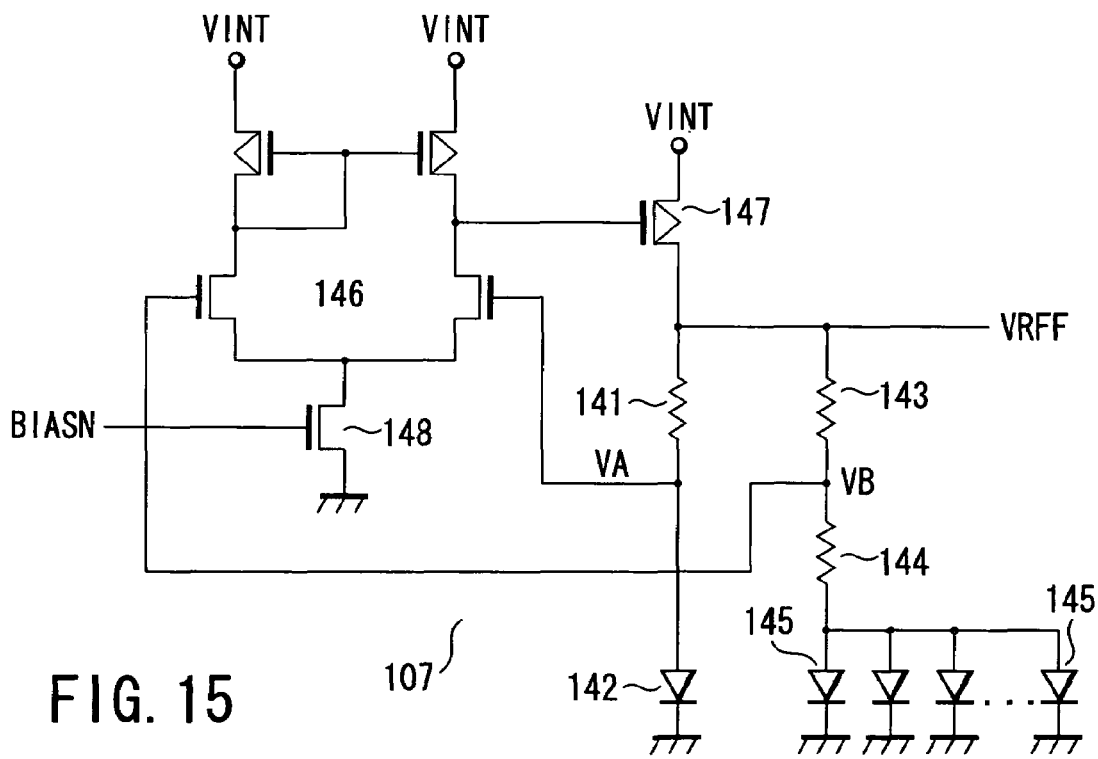
FIG. 15 is a circuit diagram showing a detailed configuration of a reference voltage circuit in FIGS. 12 and 13.

FIGS. 14 and 15 show an example of a detailed configuration of the constant current circuit 106 and reference voltage circuit 107 used in the power-on reset circuit in FIGS. 12 and 13.

FIG. 14 shows a configuration of the constant current circuit 106. A PMOS transistor 131 having its gate and drain connected together, an NMOS transistor 132, and a diode 133 are connected together in series between a boosted voltage VINT node and a ground voltage node. Further, a PMOS transistor 134, an NMOS transistor 135 having its drain and gate connected together, and a resistor 136 are connected together in series between a boosted voltage VINT node and a ground voltage node. The gates of the PMOS transistors 131 and 134 are connected together. The gates of the NMOS transistors 132 and 135 are connected together. Furthermore, a PMOS transistor 137 and an NMOS transistor 138 having its drain and gate connected together are connected together in series between a VINT node and a ground voltage node. The PMOS transistor 137 has its gate connected to the drain of the PMOS transistor 131. The gate of the NMOS transistor 138 outputs a biasing voltage BIASN.

The voltage BIASN output by the constant current circuit 106 is supplied to a gate of an NMOS transistor provided in the VCC detecting circuit 108 or the like and constituting a current mirror circuit together with the NMOS transistor 138. Then, a specified current can be provided to this NMOS transistor.

FIG. 15 shows a configuration of the reference voltage circuit 107. A resistor 141 and a diode 142 are connected in series between the reference voltage VREF and a ground voltage node. Further, one terminal of the resistor 143 is connected to the reference voltage VREF node. One terminal of a resistor 144 is connected to the other terminal of the resistor 143. Furthermore, a plurality of diodes 145 are connected together in parallel between the other terminal of the resistor 144 and a ground voltage node.

A differential amplifier 146 compares a voltage VA at the connection node between the resistor 141 and the diode 142 with a voltage VB at the connection node between the two resistors 143 and 144. An output signal from the differential amplifier 146 is supplied to a gate of a PMOS transistor 147 having its source and drain interposed between a VINT node and the reference voltage VREF node.

In this regard, the voltage BIASN output by the constant current circuit 106, shown in FIG. 14, is supplied to a gate of an NMOS transistor 148 provided in the differential amplifier 146. The NMOS transistor 148 constitutes a current mirror circuit together with the NMOS transistor 138 in FIG. 14. Consequently, the NMOS transistor 148 acts as a constant current source that allows a specified current to flow.

With this reference voltage circuit, the temperature-independent reference voltage VREF is obtained by compensating for the temperature characteristics of the diode 142 using temperature characteristics determined by the resistance ratio of the resistors 143 and 144, the resistance ratio of the resistors 141 and 143, and the number of diodes 145 connected together in parallel.

(Fourth Embodiment)

Now, a fourth embodiment will be described.

Figure 16:
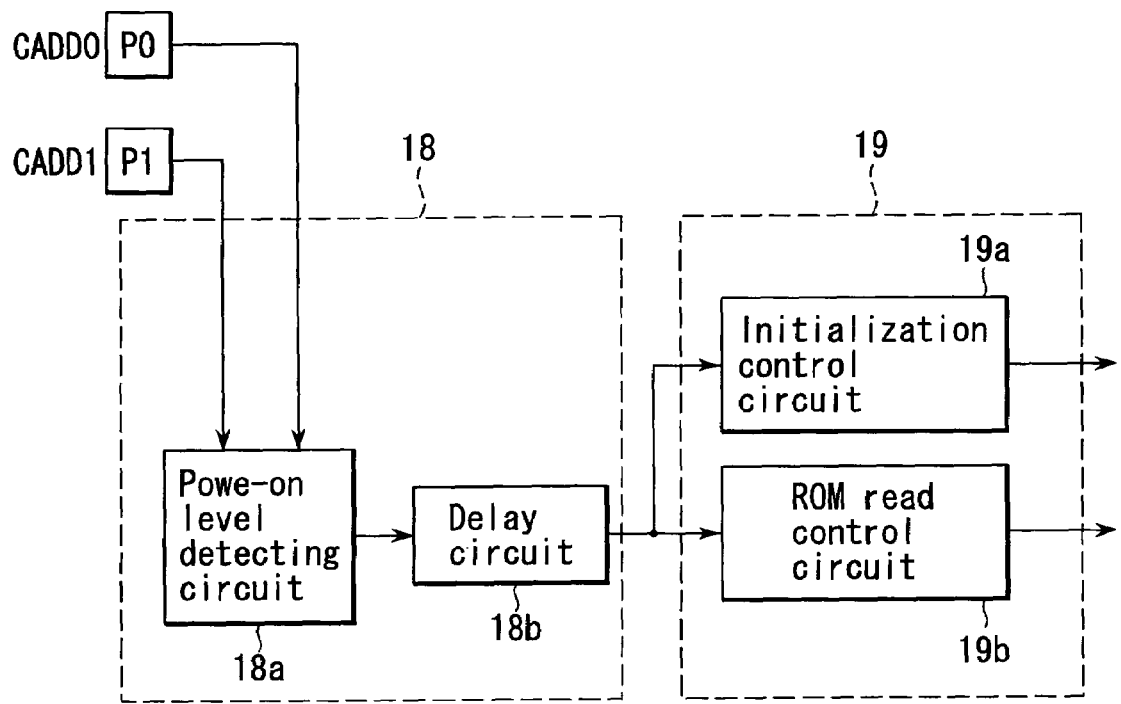
FIG. 16 is a block diagram showing the internal configuration of a power-on reset circuit and a control circuit according to a fourth embodiment.

FIG. 16 is a block diagram showing the internal configuration of the power-on reset circuit 18 and control circuit 19 in the memory chip shown in FIG. 2.

The power-on reset circuit 18 is composed of the power-on level detecting circuit 18a and the delay circuit 18b.

The control circuit 19 is composed of the initialization control circuit 19a and the ROM read control circuit 19b.

In the first to third embodiments, described previously, timing for activating a ROM read operation is shifted by controlling the delay time in the delay circuit 18b according to the chip address. In contrast, in the fourth embodiment, similar effects are produced by varying the detection level of the power-on level detecting circuit 18a depending on an externally input chip address.

Thus, the power-on level detecting circuit 18a is configured so that a power voltage detection level can be controlled according to a signal input to its pads. In this case, two bits CADD0 and CADD1 are used as a chip address. That is, in the fourth embodiment, four ($2^2$) memory chips are accommodated in the same package.

Figure 17:
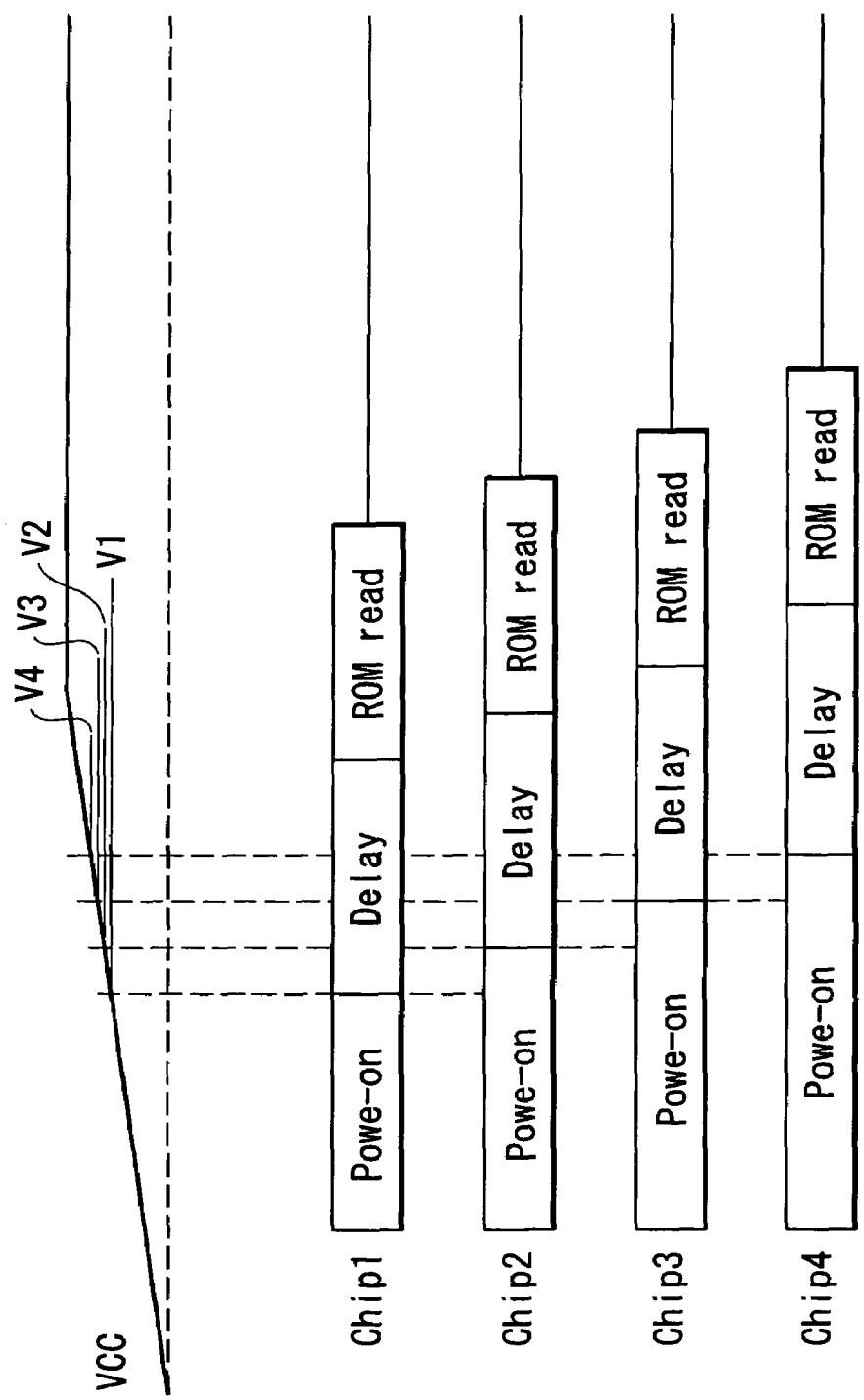
FIG. 17 is a timing chart showing an example of an operation performed by the non-volatile memory shown in FIG. 16.

The power-on level detecting circuit 18a provided in each of the four memory chips is connected to the two pads P0 and P1, to which the chip address bits CADD0 and CADD1, respectively, are supplied. The detection level of each power-on level detecting circuit 18a is set to vary sequentially depending on the chip address CADD0, CADD1 provided to the chip. For example, the following is assumed: As shown in FIG. 17, the detection level of the power-on level detecting circuit 18a of the memory chip 1 with the chip address (CADD0, CADD1) ("L", "L") is set at V1. The detection level of the power-on level detecting circuit 18a of the memory chip 2 with the chip address ("L", "H") is set at V2. The detection level of the power-on level detecting circuit 18a of the memory chip 3 with the chip address ("H", "L") is set at V3. The detection level of the power-on level detecting circuit 18a of the memory chip 4 with the chip address ("H", "H") is set at V4. The relationship V1>V2>V3>V4 is established among these detection levels.

The delay time in the delay circuit 18a is the same among the memory chips, so that no substantial differences occur among the chips.

Now, with reference to the timing chart in FIG. 17, description will be given of operations of a non-volatile memory in which non-volatile memory chips are provided each of which has the power-on reset circuit 18 and control circuit 19 configured as shown in FIG. 16.

When the power voltage VCC rises and its value reaches the detection value v1 of the power-on level detecting circuit 18a of the memory chip 1, the reset state of a power-on reset signal is cleared which is output by the power-on level detecting circuit 18a in the memory chip 1. Like FIG. 5, FIG. 17 shows the power-on reset period in which the power-on reset signal remains at the "L" level, as "power-on".

Then, when the value for the power voltage VCC reaches the detection level V2 of the power-on level detecting circuit 18a of the memory chip 2, the reset state of a power-on reset signal is cleared which is output by the power-on level detecting circuit 18a in the memory chip 2.

Similarly, when the value for the power voltage VCC reaches the detection level V3 or V4 of the power-on level detecting circuit 18a of the memory chip 3 or 4, the reset state of a power-on reset signal is cleared which is output by the power-on level detecting circuit 18a in the memory chip 3 or 4.

In this case, the detection level of the power-on level detecting circuit 18a is controlled by the 2-bit signal supplied to the pads for the chip address CADD0, CADD1. Thus, timing for clearing the power-on reset signal is sequentially shifted.

The power-on reset signal output by each power-on level detecting circuit 18a is delayed the same time by the corresponding delay circuit 18b. As in the case with FIG. 5, the delay period is shown as "Delay". Once the delay period ends, the ROM read control circuit 19b outputs a control signal that controls a ROM read operation, to activate a ROM read operation. However, since the timing for clearing the power-on reset signal is sequentially shifted among the chips, timing for activating a ROM read operation is also sequentially shifted among the chips. Thus, the timing with which the value for the current consumption of a ROM read operation exhibits a peak varies among the chips. This prevents the current consumption from increasing immediately after power-on if a plurality of non-volatile memory chips are used. This in turn eliminates the possibility of reducing the power voltage immediately after power-on, thus avoiding degradation of the power supply capability of the system.

Figure 18:
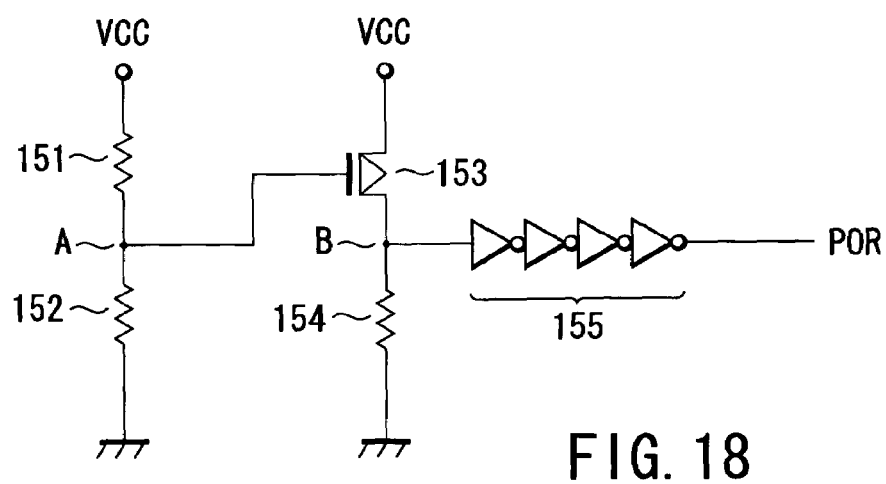
FIG. 18 is a circuit showing a detailed configuration of a power-on level detecting circuit in FIG. 16.

FIG. 18 shows an example of a configuration of the power-on level detecting circuit 18a in FIG. 16.

The power-on level detecting circuit 18a is composed of two resistors 151 and 152 connected together in series between a VCC node and a ground voltage node, a PMOS transistor 153 having a gate connected to a series connection node A between he resistors 151 and 152 and a source connected to a VCC node, a resistor 154 connected between a drain of the PMOS transistor 153 and a ground voltage node, and a waveform shaping circuit 155 which uses the power voltage VCC as an operating power supply, which is composed of an even number of cascade inverter circuits, and in which the potential at a series connection node B between the drain of the PMOS transistor 153 and the resistor 154 is input to the first inverter circuit, with the final inverter circuit outputting a power-on reset signal POR.

In this case, description will be given of operations of the power-on level detecting circuit 18a configured as described above. The resistance values of the two resistors 151 and 152 are defined as R11 and R12, and the absolute value for the threshold voltage of the PMOS transistor 153 is defined as Vthp.

Immediately after power-on, the transistor 153 is off, the potential at the node B is at the "L" level, and the power-on reset signal POR is also at the "L" level.

When the power voltage VCC increases to reach a power-on detection level Vi (Vi=(R11+R12) Vthp/R11), the transistor 153 is turned on to invert the potential at the node B to "H" level. The power-on reset signal POR is also inverted to the "H" level to clear the reset state.

In this case, to vary the detection level of the power-on level detecting circuit 18a depending on the chip address, the resistance ratio of the two resistors 151 and 152, connected in series, may be varied. For example, the detection level may be varied by fixing the resistance value R12 of the resistor 152 and using as the resistor 151 a variable resistance circuit configured as shown in FIG. 10A or 10B.

(Fifth Embodiment)

Now, a fifth embodiment of the present invention will be described.

Figure 19:
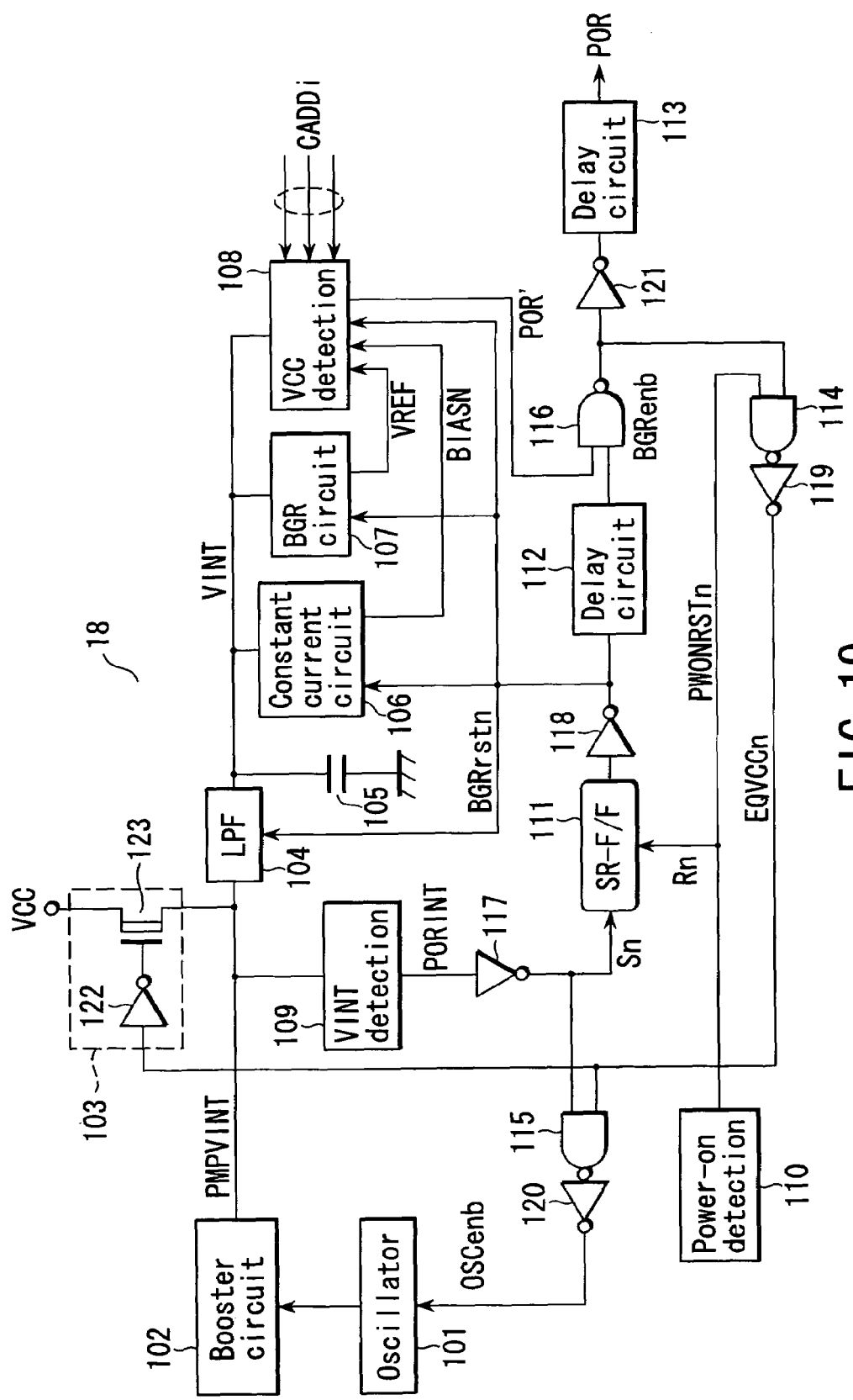
FIG. 19 is a block diagram showing the internal configuration of a power-on reset circuit according to a fifth embodiment.

FIG. 19 shows a detailed configuration of the power-on reset circuit 18 in FIG. 2. This power-on reset circuit is configured as shown in FIG. 12 or 13 except that the detection level of the VCC detecting circuit 108 is varied depending on the chip address. Accordingly, in a non-volatile memory with a plurality of memory chips, timing for activating a ROM read operation is sequentially shifted among the individual chips.

Thus, description will be given of only differences from the power-on reset circuit shown in FIG. 12 or 13. Description of correspondences to FIG. 12 or 13 is omitted.

That is, the delay time in the delay circuit 113 in FIG. 12 or the delay time in the delay circuit 112 in FIG. 13 is varied depending on the chip address. In contrast, in the fifth embodiment, the VCC detecting circuit 108 is supplied with the chip address CADDi so that its detection level varies depending on the chip address.

In the fifth embodiment, timing for detecting the power voltage VCC varies among the memory chip, and the timing for clearing the power-on reset signal POR' varies among the memory chips. Thus, the timing with which the value for the current consumption of a ROM read operation exhibits a peak varies among the chips. This prevents the current consumption from increasing immediately after power-on if a plurality of non-volatile memory chips are used. This in turn eliminates the possibility of reducing the power voltage immediately after power-on, thus avoiding degradation of the power supply capability of the system.

Figure 20:
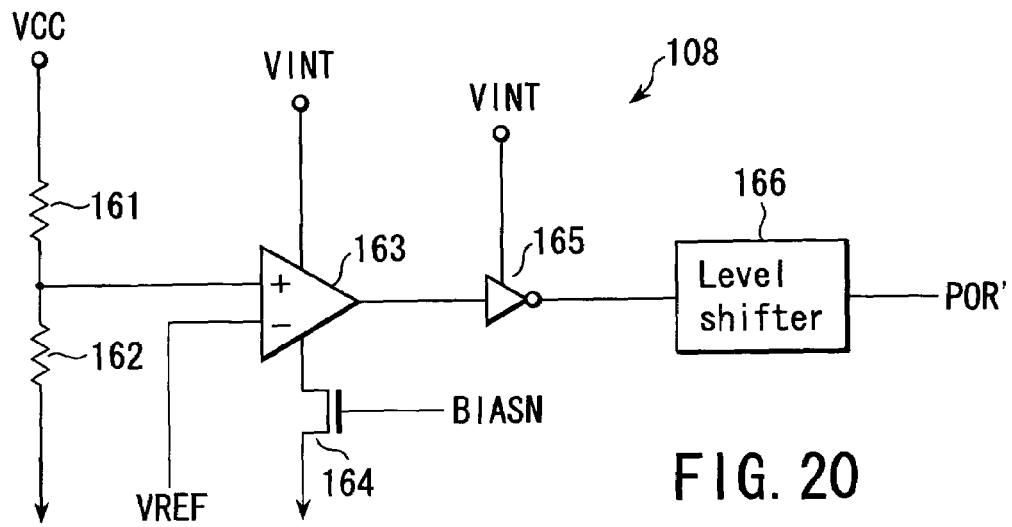
FIG. 20 is a circuit diagram showing a detailed configuration of a VCC detecting circuit in FIG. 19.

FIG. 20 shows an example of a configuration of the VCC detecting circuit 108 in FIG. 19.

The VCC detecting circuit 108 is composed of resistors 161 and 162 that divides the voltage VCC, an operational amplifier 163 that uses the boosted voltage VINT to compare the reference voltage VREF with a voltage obtained as a result of the dividing by the resistors 161 and 162, an NMOS transistor 164 that switches a current source in the operational amplifier 163, an inverter circuit 165 which uses the boosted voltage VINT as an operating power supply and to which an output from the operational amplifier 163 is supplied, and a level shifter 166 which uses the voltage VCC as an operating power supply and to which an output from the inverter circuit 165 is supplied.

The VCC detecting circuit monitors the voltage VCC and detects that the voltage VCC has reached a predetermined level to change the power-on reset signal POR' to the "H" level.

In this case, to vary the detection level of VCC detecting circuit depending on the chip address, the resistance ratio of the two resistors 161 and 162, connected in series, may be varied. For example, the detection level may be varied by fixing the resistance value of the resistor 162 and using as the resistor 161 a variable resistance circuit configured as shown in FIG. 10A or 10B.

(Sixth Embodiment)

Now, a sixth embodiment of the present invention will be described.

Figure 21:
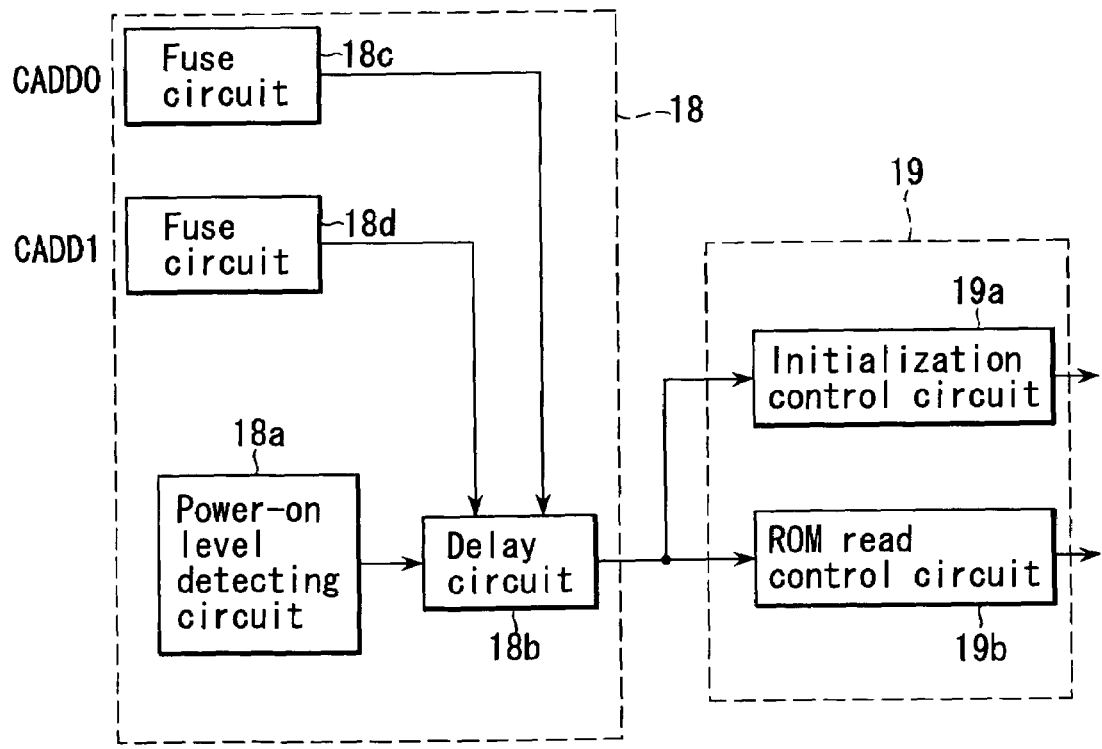
FIG. 21 is a block diagram showing the internal configuration of a power-on reset circuit and a control circuit according to a sixth embodiment.

FIG. 21 shows the internal configuration of the power-on reset circuit 18 and control circuit 19 in a memory chip such as the one shown in FIG. 2, in a non-volatile memory in which four memory chips are accommodated in the same package as shown in FIG. 3.

In the description of the first embodiment, to control the delay time in the delay circuit 18b, the chip address pads are connected to the delay circuit 18b. Then, the voltage corresponding to each chip address is connected to these pads with a bonding wire to supply the chip address CADD0, CADD1 to the delay circuit 18b.

In contrast, in the sixth embodiment, no chip address pads are provided, but instead, a fuse data circuit is additionally provided in the power-on reset circuit 18 as shown in FIG. 21. The fuse data circuit stores the chip address fuse data CADD0, CADD1, respectively, and upon power-on, reads and supplies the fuse data to the delay circuit 18b.

The fuse data circuit is composed of two fuse circuits 18c and 18d. The fuse data circuit accommodates fuse circuits the number of which corresponds to memory chips accommodate in the same package. For example, if four memory chips are provided in the same package, two fuse circuits are provided. For eight memory chips, three fuses are provided, and for 16 memory chips, four fuses are provided.

The fuse data is programmed in the two fuse circuits 18c and 18d according to the chip address for the memory chip, and is read immediately after power-on and then supplied to the delay circuit 18b.

Figure 22:
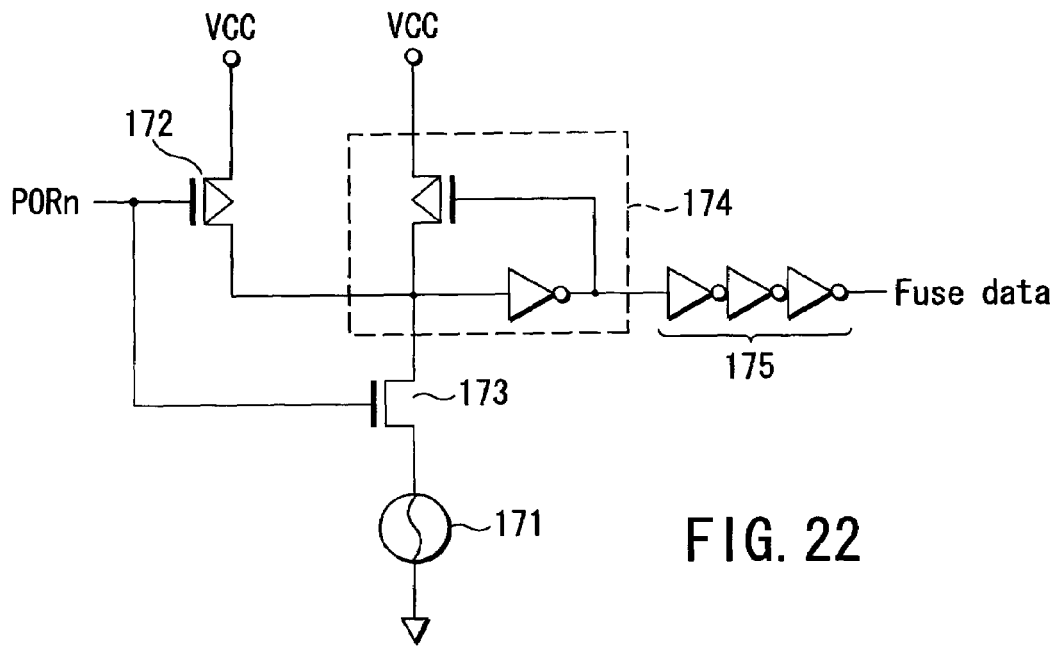
FIG. 22 is a circuit diagram showing a detailed configuration of a fuse circuit in FIG. 21.

FIG. 22 shows a detailed configuration of each of the fuse circuits 18c and 18d in FIG. 21.

The fuse circuit is composed of a fuse element 171, a resetting PMOS transistor 172, a fuse data reading NMOS transistor 173, and a latch circuit 174 that latches the fuse data, and a waveform shaping circuit 175 composed of three inverter circuits cascaded together to shape the waveform of an output from the latch circuit 174.

The fuse element 171 may be composed of, for example, a laser fuse that can be blown when irradiated with laser light, an electric fuse that controls a current conductive state by electrically breaking down a transistor or capacitor element, or the like.

The PMOS transistor 172 is interposed between a VCC node and an input node of the latch circuit 174. The NMOS transistor 173 is interposed between the input node of the latch circuit 174 and the fuse element 171. Further, gates of the PMOS transistor 172 and NMOS transistor 173 are each supplied with a power-on reset signal $POR_n$ which is at the "L" level before the power voltage VCC reaches a predetermined level and which changes to the "H" level when the voltage VCC reaches the predetermined level. The VCC detection level at which the power-on reset signal $POR_n$ changes to the "H" level is lower than the VCC detection level in the power-on level detecting circuit 18a in FIG. 21.

The fuse circuit configured as described above operates as follows:

After power-on and before the power-on reset signal $POR_n$ changes to the "H" level, the resetting PMOS transistor 172 is turned on, and the input node of the latch circuit is reset to the "H" level. Then, when the power-on reset signal $POR_n$ changes to the "H" level, the resetting PMOS transistor 172 is turned off to turn the fuse data reading NMOS transistor 173 on. Then, the data from the fuse element 171 is supplied to the latch circuit 174.

In this case, if the fuse element 171 has been programmed so as to prevent current from flowing through, the reset state of the input node of the latch circuit 174 is maintained. Thus, the "L" data is read into the latch circuit 174, where it is latched. Then, "H" level fuse data is output.

On the other hand, if the fuse element 171 is programmed so as to allow current to flow through, the input node of the latch circuit 174 is discharged to the "L" level. Thus, the "H" data is read into the latch circuit 174, where it is latched. Then, "L" level fuse data is output.

Then, the 2-bit fuse data is supplied to each delay circuit 18b, so that the delay time in the delay circuit 18b is controlled so as to vary among the memory chips. The circuit shown in FIG. 6 or 8 can be used directly as the delay circuit 18b.

Further, the VCC detection level at which the power-on reset signal $POR_n$ changes to the "H" level is lower than the VCC detection level in the power-on level detecting circuit 18a. Accordingly, the power-on reset signal POR output by the power-on level detecting circuit 18a does not change to the "H" level before the fuse data is read from the fuse data circuit. Therefore, the delay circuit 18b can reliably control the delay time.

As described above, also in the sixth embodiment, the timing for clearing the power-on reset signal POR can be varied among the memory chips by varying the delay time for the power-on reset signal. Thus, the timing with which the value for the current consumption of a ROM read operation exhibits a peak varies among the chips. This prevents the current consumption from increasing immediately after power-on if a plurality of non-volatile memory chips are used. This in turn eliminates the possibility of reducing the power voltage immediately after power-on, thus avoiding degradation of the power supply capability of the system.

(Seventh Embodiment)

Now, a seventh embodiment of the present invention will be described.

Figure 23:
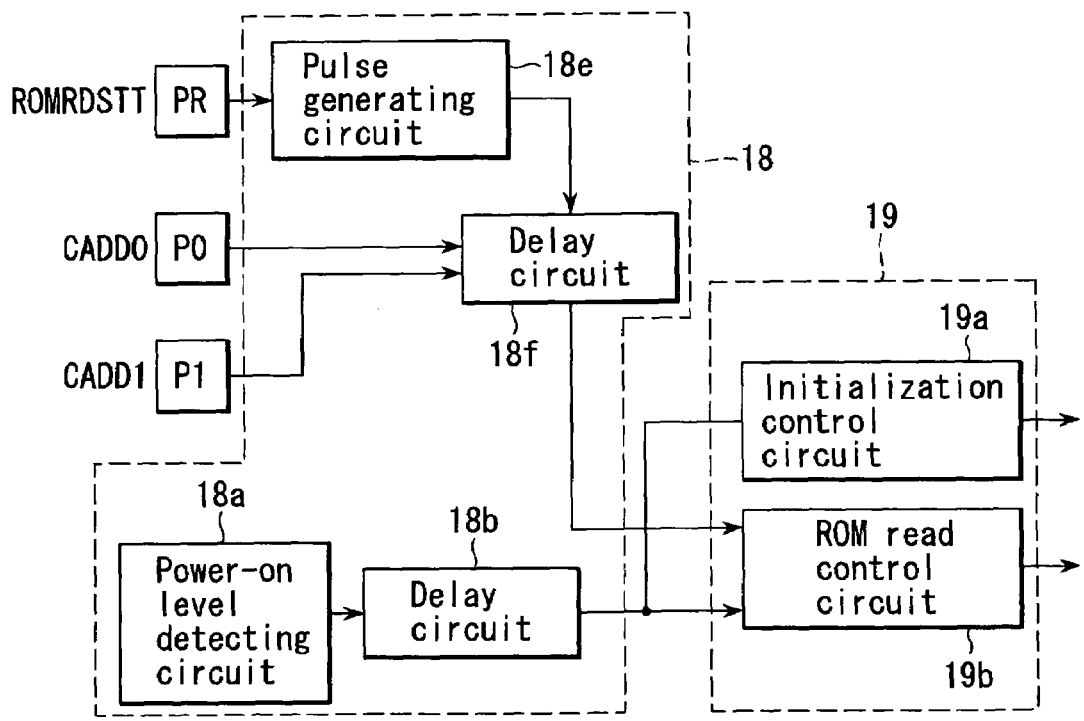
FIG. 23 is a block diagram showing the internal configuration of a power-on reset circuit and a control circuit according to a seventh embodiment.

FIG. 23 shows the internal configuration of the power-on reset circuit 18 and control circuit 19 in a memory chip such as the one shown in FIG. 2, in a non-volatile memory in which four memory chips are accommodated in the same package as shown in FIG. 3.

In the description of the first to sixth embodiments, a ROM read operation is automatically activated upon power-on. However, in the seventh embodiment, a ROM read operation is activated in response to a signal supplied to a pad for activating a ROM read operation. Further, the timing for activating a ROM read operation varies among the plurality of memory chips.

In the seventh embodiment, as shown in FIG. 23, the delay time in the delay circuit 18b in the power-on reset circuit 18 is not varied depending on the chip address but is fixed. A pulse generating circuit 18e and a delay circuit 18f are additionally provided in the power-on reset circuit 18.

A pad PR is connected to the pulse generating circuit 18e and is supplied with a ROM read activating control signal ROMRDSTT that activates a ROM read operation. The pads PR of the plurality of memory chips are connected together with wires (not shown). Then, the pulse generating circuit 18e generates a pulse signal when the control signal ROMRDSTT changes from "L" level to "H" level or from "H" level to "L" level. This pulse signal is supplied to the delay circuit 18f.

The delay circuit 18f delays the pulse signal. Furthermore, the two chip address specifying pads P0 and P1 are connected to the delay circuit 18f so that delay time in the delay circuit 18f is controlled according to the chip address CADD0, CADD1 supplied to these two pads, respectively.

In this case, the relationship between the chip address CAADD0, CADD1 supplied to the two chip address specifying pads P0 and P1 of each of the four memory chips shown in FIG. 3 and the delay time in the delay circuit 18f, provided in each memory chip, is, for example, similar to that shown in Table 1.

An output signal from the delay circuit 18f is supplied to a ROM read control circuit 19b. This signal is used to activate a ROM read operation.

As shown in FIG. 23, the output from the delay circuit 18b with the fixed delay time is also supplied to the ROM read control circuit 19b. However, this signal is input in order to reset a latch circuit provided in the read control circuit 19b, and does not activate a ROM read operation.

Figure 24:
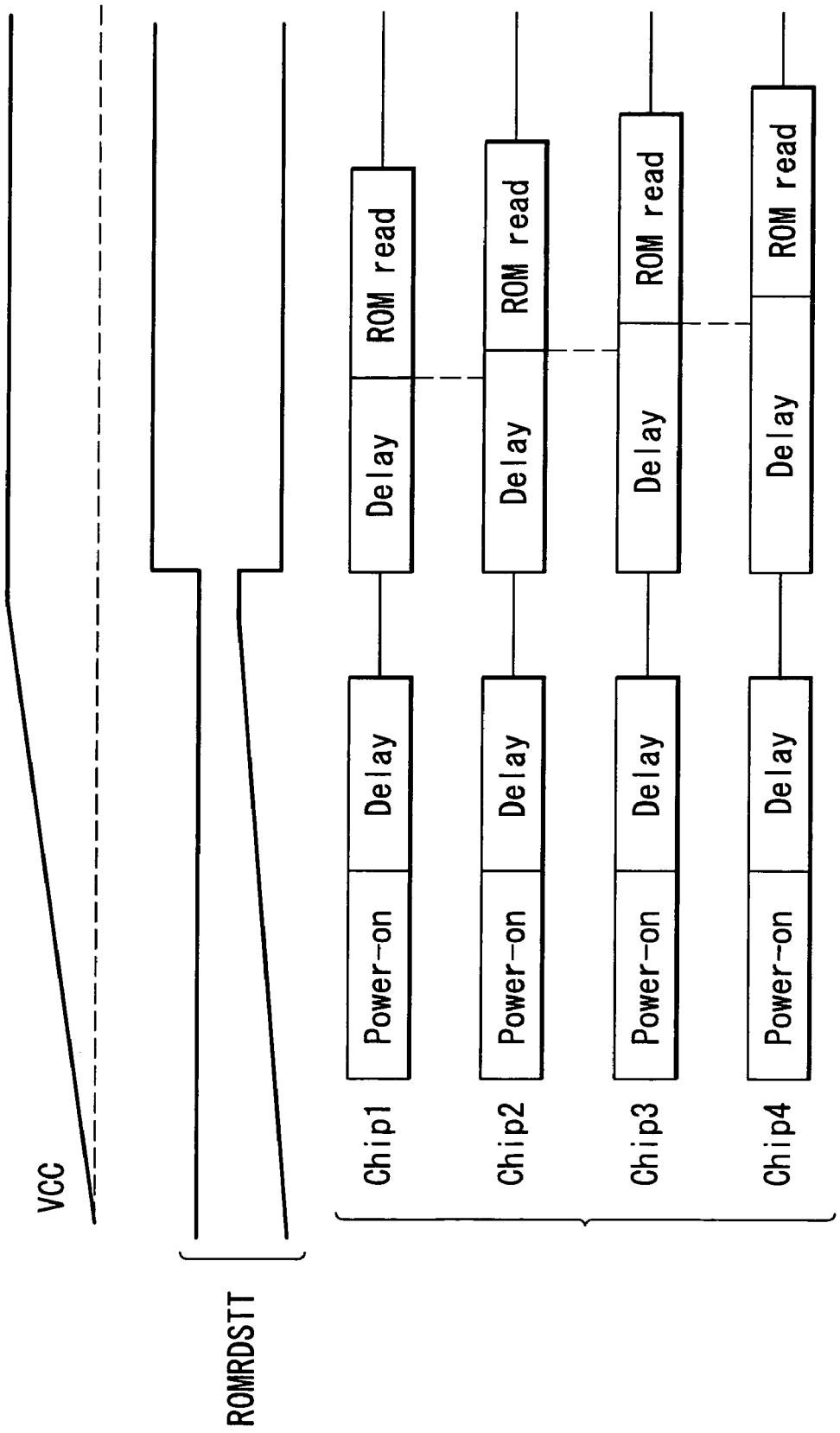
FIG. 24 is a timing chart showing an example of an operation performed by the non-volatile memory shown in FIG. 23.

Now, operations of the non-volatile memory configured as described above will be described with reference to the timing chart in FIG. 24. When the power voltage VCC rises and its value reaches the power-on detection level, the power-on level detecting circuit 18a in each memory chip outputs a power-on reset signal. FIG. 24 shows the power-on reset period in which the power-on reset signal remains at the "L" level, as "power-on". Subsequently, the power-on reset signal is delayed by the delay circuit 18b. The delay time in the delay circuit 18b is the same for all memory chips, and is shown as "Delay". Once this delay period ends, the initialization control circuit 19a outputs a control signal that controls an initializing operation, to initialize the chip internal circuit. Furthermore, the latch circuit provided in the ROM read control circuit 19b is reset. That is, no ROM read operations are activated upon power-on.

After power-on and while the power voltage VCC is being stabilized, the signal ROMRDSTT supplied to the pad PR changes from "L" level to "H" level or from "H" level to "L" level. Then, the pulse generating circuit 18e generates a pulse signal. This pulse signal is delayed by the delay circuit 18f. The delay time is controlled by the 2-bit chip address CADD0, CADD1 supplied to the pads P0 and P1, respectively, and is varied among the four memory chips. The output from the delay circuit 18f activates a ROM read operation in the ROM read control circuit 19b. Consequently, as shown in FIG. 24, the timing for activating a ROM read operation is shifted among the chips.

Thus, the timing with which the value for the current consumption of a ROM read operation exhibits a peak varies among the chips. This prevents the current consumption from increasing immediately after power-on if a plurality of non-volatile memory chips are used. This in turn eliminates the possibility of reducing the power voltage immediately after power-on, thus avoiding degradation of the power supply capability of the system.

It should be appreciated that the present invention is not limited to the above embodiments and that various variations are possible. For example, in the above description, the non-volatile memory chips are NAND flash memory chips. However, these flash memory chips may be of a NOR, DINOR, AND, or another type.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data read method for a semiconductor device having a plurality of independently-controllable ROM regions comprising:

inputting a read command and a read address after a power supply voltage is applied, the read command and read address including information that corresponds to one of the ROM regions; and reading data out of the ROM region specified by the information included in the read command and read address, after the read command and read address are input, wherein the independently-controllable ROM regions are $2^n$ (where n is a natural number) in number, and the semiconductor device includes n pads so as to specify the information corresponding to one of the ROM regions.

2. The method according to claim 1, wherein a plurality of memory chips are provided, and the ROM regions include:

a first ROM region which is included in a first memory chip of the plurality of memory chips; and a second ROM region which is different from the first memory chip and included in a second memory chip of the plurality of memory chips.

3. The method according to claim 2, wherein a delay time provided by a delay circuit included in the first ROM region and a delay time provided by a delay circuit included in the second ROM region differ from each other.

4. The method according to claim 1, wherein each of the ROM regions are included in a NAND flash memory.

5. A data read method for a semiconductor device having a plurality of independently-controllable ROM regions comprising:

inputting a read command and a read address after a power supply voltage is applied, the read command and read address including information that corresponds to one of the ROM regions; and reading data out of the ROM region specified by the information included in the read command and read address, after the read command and read address are input, wherein each of the ROM regions includes a delay circuit, and data is read out of the ROM region specified by the information included in the read command and read address, after the read command and read address are input and after lapse of a delay time provided by a delay circuit corresponding to the ROM region specified by the information included in the read command and read address.

6. The method according to claim 5, wherein a plurality of memory chips are provided, and the ROM regions include:

a first ROM region which is included in a first memory chip of the plurality of memory chips; and a second ROM region which is different from the first memory chip and included in a second memory chip of the plurality of memory chips.

7. The method according to claim 6, wherein a delay time provided by a delay circuit included in the first ROM region and a delay time provided by a delay circuit included in the second ROM region differ from each other.

8. The method according to claim 5, wherein the independently-controllable ROM regions are $2^n$ (where n is a natural number) in number, and the semiconductor device includes n pads so as to specify the information corresponding to one of the ROM regions.

9. The method according to claim 5, wherein each of the ROM regions are included in a NAND flash memory.

10. A data read method for a semiconductor device having a plurality of independently-controllable ROM regions comprising:
inputting a read command and a read address after a power supply voltage is applied, the read command and read address including information that corresponds to one of the ROM regions; and
reading data out of the ROM region specified by the information included in the read command and read address, after the read command and read address are input,
wherein each of the ROM regions are included in a NAND flash memory.

11. The method according to claim 10, wherein a plurality of memory chips are provided, and the ROM regions include:
a first ROM region which is included in a first memory chip of the plurality of memory chips; and
a second ROM region which is different from the first memory chip and included in a second memory chip of the plurality of memory chips.

12. The method according to claim 10, wherein the independently-controllable ROM regions are $2^n$ (where n is a natural number) in number, and the semiconductor device includes n pads so as to specify the information corresponding to one of the ROM regions.

13. The method according to claim 12, wherein a delay time provided by a delay circuit included in the first ROM region and a delay time provided by a delay circuit included in the second ROM region differ from each other.

* * * * *